(12) United States Patent
Chong et al.

(10) Patent No.: US 10,199,396 B2
(45) Date of Patent: Feb. 5, 2019

(54) DISPLAY DEVICE HAVING IMPROVED MANUFACTURABILITY AND METHOD FOR FABRICATING SAME

(71) Applicant: SAMSUNG DISPLAY CO., LTD., Yongin-si, Gyeonggi-do (KR)

(72) Inventors: Joonggun Chong, Yongin-si (KR); Yeogeon Yoon, Suwon-si (KR); Juae Youn, Seoul (KR); Jehong Choi, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/426,664

(22) Filed: Feb. 7, 2017

(65) Prior Publication Data

US 2017/0236843 A1    Aug. 17, 2017

(30) Foreign Application Priority Data

Feb. 17, 2016    (KR) .......................... 10-2016-0018308

(51) Int. Cl.
*H01L 27/12*    (2006.01)
*G02F 1/1343*    (2006.01)
(Continued)

(52) U.S. Cl.
CPC ........ *H01L 27/1225* (2013.01); *G02F 1/1362* (2013.01); *G02F 1/1368* (2013.01); *G02F 1/13439* (2013.01); *G02F 1/134336* (2013.01); *G02F 1/136209* (2013.01); *G02F 1/136286* (2013.01); *H01L 27/124* (2013.01); *H01L 27/127* (2013.01); *H01L 27/1248* (2013.01);
(Continued)

(58) Field of Classification Search
CPC .............. H01L 27/1225; H01L 27/124; H01L 27/1248; H01L 27/1262; H01L 27/127; H01L 27/1288; G02F 1/134336; G02F 1/1362; G02F 1/136209; G02F 1/136286; G02F 1/1368; G02F 2001/136231; G02F 2001/136295; G02F 2001/13685
See application file for complete search history.

(56) References Cited

U.S. PATENT DOCUMENTS 5,583,366 A * 12/1996 Nakazawa ........ H01L 21/28079
257/347
8,379,176 B2    2/2013 Kim et al.
(Continued)

FOREIGN PATENT DOCUMENTS

KR    10-2008-0049984 A    6/2008
KR    10-2012-0074967 A    7/2012
(Continued)

*Primary Examiner* — Cheung Lee
*Assistant Examiner* — Stephen C Smith
(74) *Attorney, Agent, or Firm* — Innovation Counsel LLP

(57) ABSTRACT

A display device and a method of fabricating the display device may simplify a fabrication process and reduce fabrication cost. The display device includes: a substrate; a gate line and a data line on the substrate; a switching element connected to the gate line and the data line, the switching element including a source electrode and a drain electrode; and a first pixel electrode connected to the switching element. At least one of the source electrode and the drain electrode of the switching element includes substantially a same material as a material included in the first pixel electrode.

13 Claims, 27 Drawing Sheets

(51) Int. Cl.
*G02F 1/1362* (2006.01)
*G02F 1/1368* (2006.01)

(52) U.S. Cl.
CPC ...... *H01L 27/1262* (2013.01); *H01L 27/1288* (2013.01); *G02F 2001/13685* (2013.01); *G02F 2001/136231* (2013.01); *G02F 2001/136295* (2013.01)

(56) References Cited

U.S. PATENT DOCUMENTS

| | | | |
|---|---|---|---|
| 8,629,825 B2 | 1/2014 | Park | |
| 9,048,326 B2 | 6/2015 | Choi et al. | |
| 9,201,281 B2 | 12/2015 | Jeong et al. | |
| 2003/0136962 A1* | 7/2003 | Miyajima | G02F 1/136213 257/59 |
| 2007/0242203 A1* | 10/2007 | Lee | G02F 1/134363 349/141 |
| 2015/0103284 A1* | 4/2015 | Nagasawa | G02F 1/134336 349/46 |
| 2016/0027818 A1* | 1/2016 | Yoo | G02F 1/136286 257/43 |

FOREIGN PATENT DOCUMENTS

| | | |
|---|---|---|
| KR | 10-2013-0100600 A | 9/2013 |
| RE | 10-2013-0101329 A | 9/2013 |

\* cited by examiner

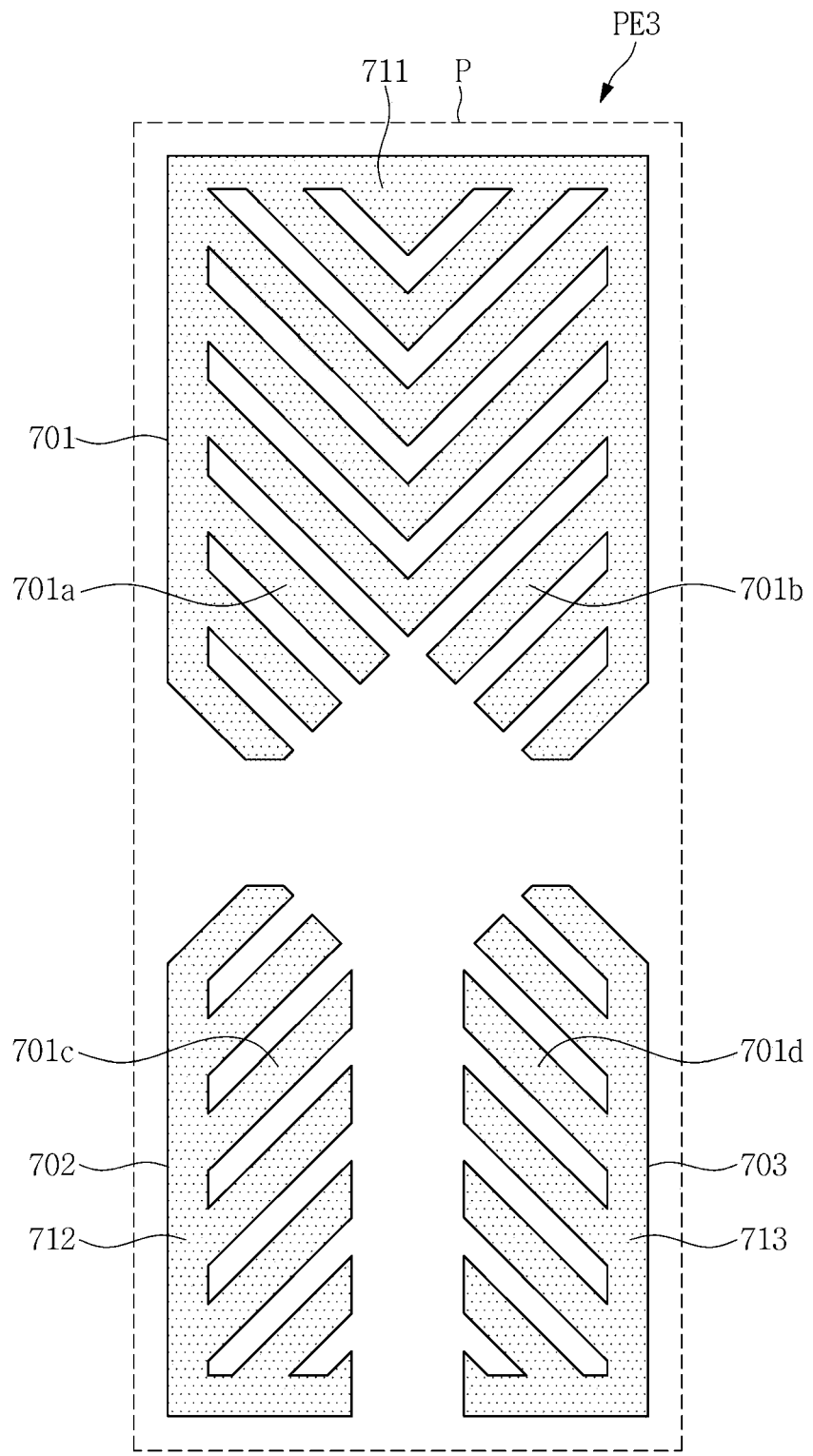

DISPLAY DEVICE HAVING IMPROVED MANUFACTURABILITY AND METHOD FOR FABRICATING SAME

This application claims priority to Korean Patent Application No. 10-2016-0018308 filed on Feb. 17, 2016, and all the benefits accruing therefrom under 35 U.S.C. § 119, the content of which in its entirety is herein incorporated by reference.

BACKGROUND

1. Field

Exemplary embodiments of the invention relate generally to a display device and a method of fabricating the display device, and more particularly to a display device capable of simplifying a fabrication process and reducing a fabrication cost, as well as a method of fabricating the display device.

2. Description of the Related Art

Liquid crystal display (LCD) devices are a type of flat panel display (FPD) devices which are currently in wide use. An LCD device includes two substrates including two electrodes respectively formed thereon, and a liquid crystal layer interposed therebetween.

Upon applying a voltage to the two electrodes, liquid crystal molecules of the liquid crystal layer are rearranged such that an amount of transmitted light is controlled so as to generate a desired image.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Exemplary embodiments of the invention are directed to a display device capable of reducing the number of masks used to fabricate the display device, to thereby simplify a fabrication process and reduce fabrication cost. Embodiments are also directed to a method of fabricating the display device.

According to an exemplary embodiment of the invention, a display device includes: a substrate; a gate line and a data line on the substrate; a switching element connected to the gate line and the data line, the switching element including a source electrode and a drain electrode; and a first pixel electrode connected to the switching element. At least one of the source electrode and the drain electrode of the switching element includes substantially a same material as a material included in the first pixel electrode.

A semiconductor layer of the switching element, the source electrode, the drain electrode, and the first pixel electrode each may include substantially a same semiconductor material.

Each of the source electrode, the drain electrode, and the first pixel electrode may include a greater amount of impurities than an amount of impurities included in the semiconductor layer.

The semiconductor material may include one of indium gallium zinc oxide (IGZO) and amorphous indium gallium zinc oxide (a-IGZO)

At least one of the source electrode and the drain electrode may be unitary with the first pixel electrode.

The semiconductor layer of the switching element may be unitary with at least one of the source electrode and the drain electrode.

At least one of the source electrode and the drain electrode may have substantially a same thickness as a thickness of the first pixel electrode.

The semiconductor layer of the switching element may have substantially a same thickness as the thickness of the first pixel electrode.

The display device may further include a light blocking electrode on the data line. The light blocking electrode may include substantially a same material as a material included in the first pixel electrode.

The display device may further include an insulating interlayer on the semiconductor layer of the switching element; and a gate electrode disposed on the insulating interlayer and connected to the gate line.

The insulating interlayer may have substantially a same shape as a shape of the gate line and the gate electrode.

The display device may further include a passivation layer on the gate electrode, the gate line, and the first pixel electrode; a second pixel electrode disposed on the passivation layer and connected to the drain electrode through a drain contact hole in the passivation layer; and a third pixel electrode disposed on the passivation layer and not physically contacting another conductor; a data insulating layer between the data line and the passivation layer; and a connecting electrode connecting the source electrode and the data line through a source contact hole in the passivation layer and a data contact hole in the passivation layer and the data insulating layer.

The display device may further include a gate electrode disposed between the substrate and the semiconductor layer of the switching element, the gate electrode connected to the gate line; a gate insulating layer between the gate electrode and the semiconductor layer, between the substrate and the source electrode, between the substrate and the drain electrode, between the substrate and the first pixel electrode, and between the substrate and the data line; and a masking pattern on the semiconductor layer.

The display device may further include a passivation layer on the source electrode, the drain electrode, the semiconductor layer, the first pixel electrode, the data line, and the masking pattern; a second pixel electrode disposed on the passivation layer and connected to the drain electrode through a drain contact hole in the passivation layer; a third pixel electrode disposed on the passivation layer and not physically connecting another conductor; and a connecting electrode connecting the source electrode and the data line through a source contact hole in the passivation layer and a data contact hole in the passivation layer.

According to another exemplary embodiment, a method of fabricating a display device includes: forming a data line on a substrate; forming a data insulating layer on the substrate and the data line; forming a first semiconductor pattern on the data insulating layer; forming an insulating interlayer and a gate electrode on the first semiconductor pattern, the insulating interlayer and the gate electrode overlapping a portion of the first semiconductor pattern; and injecting impurities in a selective manner into the first semiconductor pattern using the gate electrode and the insulating interlayer as a mask, so as to form a source electrode, a drain electrode, a semiconductor layer, and a first pixel electrode from the first semiconductor pattern.

The method may further include: forming a second semiconductor pattern on the data insulating layer, the second semiconductor pattern overlapping the data line; and injecting impurities into the second semiconductor pattern using the gate electrode and the gate insulating layer as a mask, so as to form a light blocking electrode.

The first semiconductor pattern and the second semiconductor pattern may include a same material.

The method may further include: forming a passivation layer on the gate electrode and the first pixel electrode; defining a source contact hole and a drain contact hole in the passivation layer and defining a data contact hole in the passivation layer and the data insulating layer; and forming, on the passivation layer, a second pixel electrode connected to the drain electrode through the drain contact hole, a third pixel electrode not physically contacting another conductor, and a connecting electrode connecting the source electrode and the data line through the source contact hole and the data contact hole.

According to still another exemplary embodiment, a method of fabricating a display device includes: forming a gate electrode on a substrate; forming a gate insulating layer on the gate electrode; forming a semiconductor pattern on the gate insulating layer; forming a data line on the gate insulating layer and forming a masking pattern on the semiconductor pattern, the masking pattern overlapping a portion of the semiconductor pattern; and performing a plasma treatment upon the semiconductor pattern in a selective manner using the masking pattern as a mask, so as to form a source electrode, a drain electrode, a semiconductor layer, and a first pixel electrode from the semiconductor pattern.

The method may further include: forming a passivation layer on the source electrode, the drain electrode, the semiconductor layer, the first pixel electrode, the data line, and the masking pattern; defining a source contact hole, a drain contact hole, and a data contact hole in the passivation layer; and forming, on the passivation layer, a second pixel electrode connected to the drain electrode through the drain contact hole, a third pixel electrode not physically contacting another conductor, and a connecting electrode connecting the source electrode and the data line through the source contact hole and the data contact hole.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of invention will be more clearly understood from the following detailed description taken in conjunction with the accompanying drawings, in which:

FIG. 7 is a view separately illustrating the third pixel electrode of FIG. 5;

DETAILED DESCRIPTION

Figure 1:
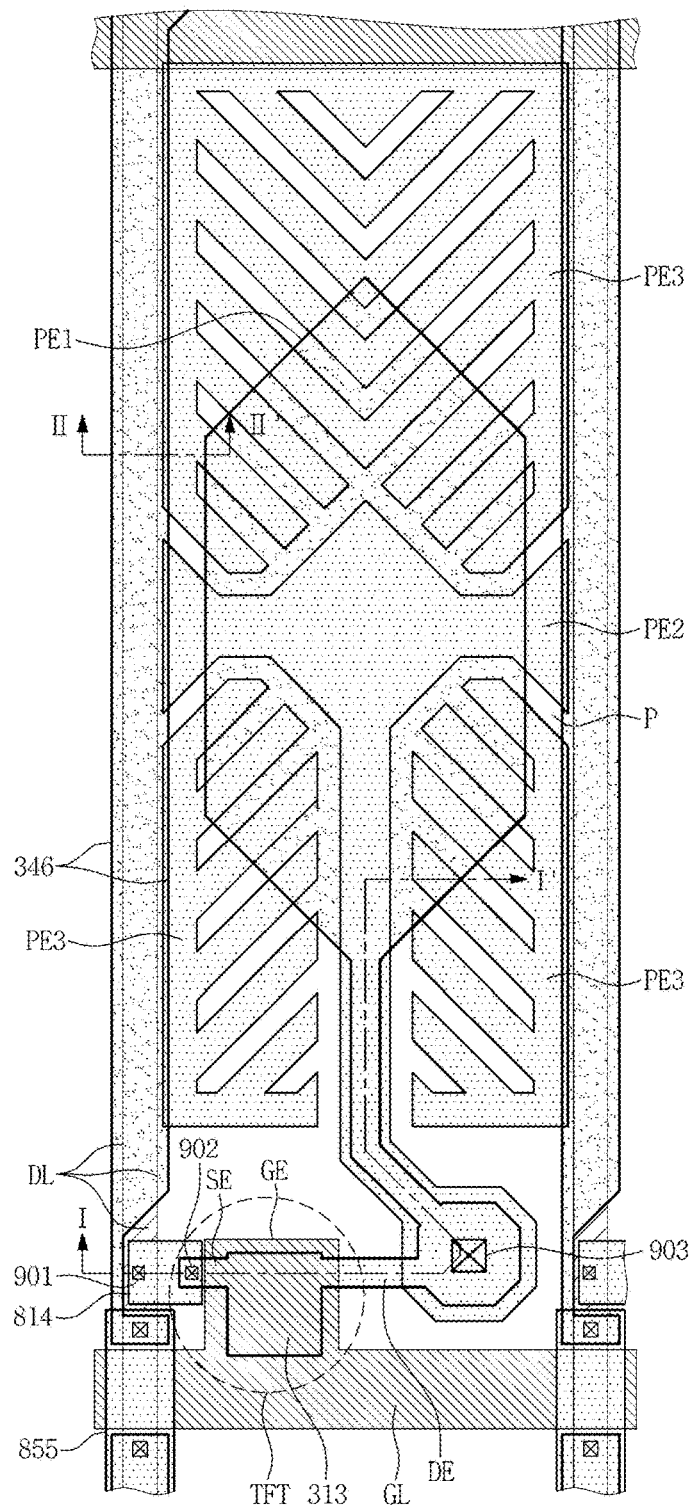
FIG. 1 is a plan view illustrating an exemplary embodiment of a display device.

Exemplary embodiments will now be described more fully hereinafter with reference to the accompanying drawings. Although the invention can be modified in various manners and have several embodiments, exemplary embodiments are illustrated in the accompanying drawings and will be mainly described in the specification. However, the scope of the invention is not limited to the exemplary embodiments and should be construed as including all the changes, equivalents, and substitutions included in the spirit and scope of the invention.

In the drawings, certain elements or shapes may be illustrated in an enlarged manner or in a simplified manner to better illustrate the invention, and other elements present in an actual product may also be omitted. Thus, the drawings are intended to facilitate the understanding of the present invention, and the drawings are not necessarily to scale.

When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms used herein (including technical and scientific terms) have a same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification. All numerical values are approximate, and may vary. All examples of specific materials and compositions are to be taken as nonlimiting and exemplary only. Other suitable materials and compositions may be used instead.

Hereinafter, a display device and a method of fabricating the display device will be described in detail with reference to FIGS. 1 to 20.

Figure 2:
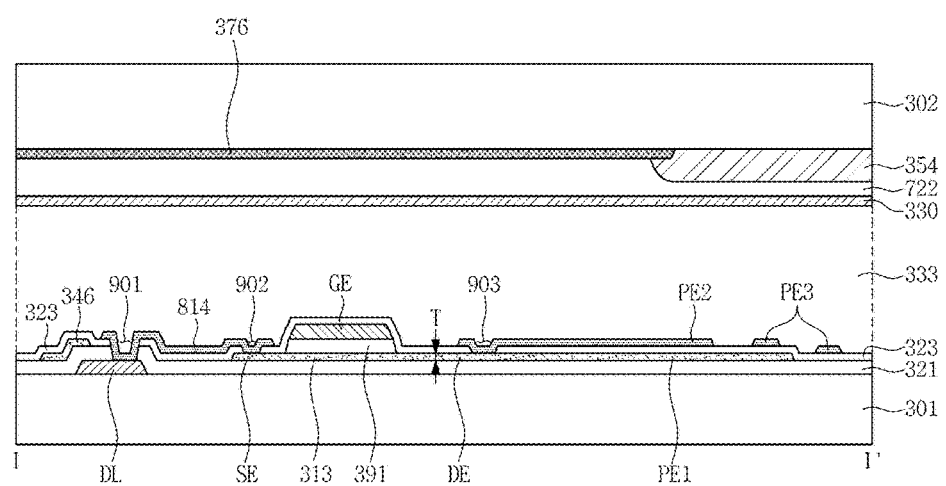
FIG. 2 is a cross-sectional view illustrating an exemplary embodiment taken along line I-I' of FIG. 1.

FIG. 1 is a plan view illustrating an exemplary embodiment of the display device; FIG. 2 is a cross-sectional view illustrating an exemplary embodiment taken along line I-I' of FIG. 1; and FIG. 3 is a cross-sectional view illustrating an exemplary embodiment taken along line II-II' of FIG. 1.

Figure 3:
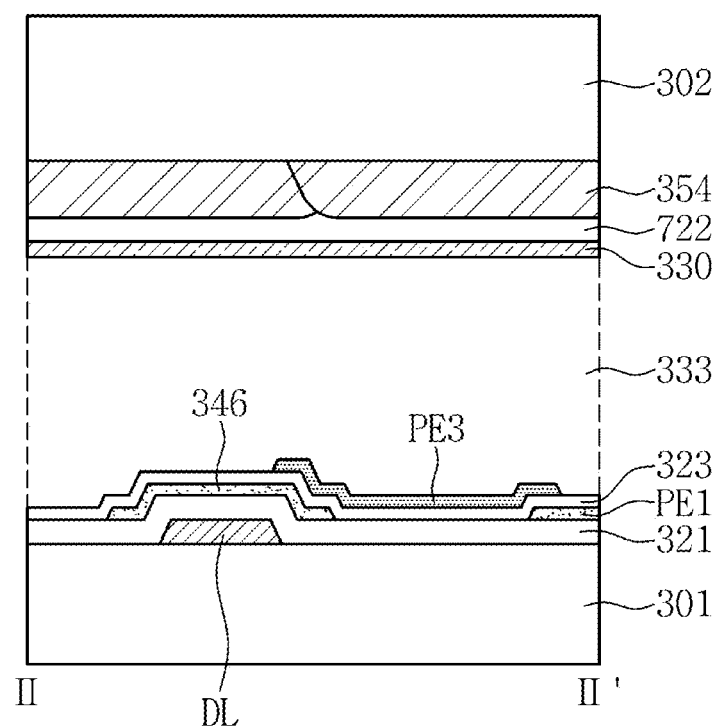
FIG. 3 is a cross-sectional view illustrating an exemplary embodiment taken along line II-II' of FIG. 1.

As illustrated in FIGS. 1, 2, and 3, the display device includes a first substrate 301, a second substrate 302, a thin film transistor TFT, a first pixel electrode PE1, a second pixel electrode PE2, a third pixel electrode PE3, a light blocking electrode 346, a data insulating layer 321, an insulating interlayer 391, a passivation layer 323, a light blocking layer 376, a color filter 354, an overcoat layer 722, a common electrode 330, and a liquid crystal layer 333. Herein, the overcoat layer 722 may be omitted.

As illustrated in FIGS. 1 and 2, the thin film transistor (TFT) includes a gate electrode GE, a semiconductor layer 313, a source electrode SE, and a drain electrode DE.

Although not illustrated, an exemplary embodiment of the display device may further include a first polarizer and a second polarizer. In the case that surfaces of the first substrate 301 and the second substrate 302 that face each other are defined as upper surfaces of the corresponding substrates, and surfaces opposite to the upper surfaces are defined as lower surfaces of the corresponding substrates, the aforementioned first polarizer is disposed above the lower surface of the first substrate 301, and the second polarizer is disposed above the lower surface of the second substrate 302.

A transmission axis of the first polarizer is perpendicular to a transmission axis of the second polarizer, and one of the transmission axes thereof is oriented parallel to the gate line GL. In an alternative exemplary embodiment, the display device (e.g., a liquid crystal display (LCD) device) may include only one of the first polarizer and the second polarizer.

The first substrate 301 and the second substrate 302 are each an insulating substrate including glass or plastic.

The data line DL is disposed on the first substrate 301. An end portion of the data line DL may be connected to another layer or to an external driving circuit. The end portion of the data line DL may have a greater plan-view area than a plan-view area of another portion of the data line DL. Although not illustrated, in order to secure a high transmittance (e.g., a maximum transmittance) of the display device, a middle portion of the data line DL may be bent into a V-like shape.

The data line DL may include or be formed of refractory metal, such as molybdenum, chromium, tantalum, and titanium, or an alloy thereof. The data line DL may have a multilayer structure including a refractory metal layer and a low-resistance conductive layer. Examples of the multilayer structure may include: a double-layer structure including a chromium or molybdenum (alloy) lower layer and an aluminum (alloy) upper layer; and a triple-layer structure including a molybdenum (alloy) lower layer, an aluminum (alloy) intermediate layer, and a molybdenum (alloy) upper layer. In an alternative exemplary embodiment, the data line DL may include or be formed of any suitable metals or conductors rather than the aforementioned materials.

As illustrated in FIGS. 2 and 3, the data insulating layer 321 is disposed on the data line DL and the first substrate 301. The data insulating layer 321 may be disposed over the entire surface of the first substrate 301 including the data line DL. The data insulating layer 321 has a data contact hole 901, and the data contact hole 901 is defined or positioned on the data line DL.

The data insulating layer 321 may include silicon nitride (SiNx) or silicon oxide (SiOx), for example. The data insulating layer 321 may have a multilayer structure including at least two insulating layers that have different physical properties.

The light blocking electrode 346, the source electrode SE, the semiconductor layer 313, the drain electrode DE, and the first pixel electrode PE1 are disposed on the data insulating layer 321.

As illustrated in FIGS. 1 and 2, the semiconductor layer 313 is disposed between the source electrode SE and the drain electrode DE.

At least one of the light blocking electrode 346, the source electrode SE, the semiconductor layer 313, and the drain electrode DE is disposed on a same layer as a layer on which the first pixel electrode PE1 is disposed. For example, as illustrated in FIG. 2, the light blocking electrode 346, the source electrode SE, the semiconductor layer 313, the drain electrode DE, and the first pixel electrode PE1 are disposed on the data insulating layer 321.

The source electrode SE, the semiconductor layer 313, the drain electrode DE, and the first pixel electrode PE1 are unitary. In other words, the source electrode SE, the semiconductor layer 313, the drain electrode DE, and the first pixel electrode PE1 are formed into a single unitary and continuous structure without an interface thereamong. That is, a physical interface between the source electrode SE and the semiconductor layer 313, a physical interface between the semiconductor layer 313 and the drain electrode DE, and a physical interface between the drain electrode DE and the first pixel electrode PE1 are all absent.

The light blocking electrode 346, the source electrode SE, the semiconductor layer 313, the drain electrode DE, and the first pixel electrode PE1 have substantially a same thickness T, since the light blocking electrode 346, the source electrode SE, the semiconductor layer 313, the drain electrode DE, and the first pixel electrode PE1 are manufactured from a same semiconductor material (e.g., indium gallium zinc oxide (IGZO) or amorphous indium gallium zinc oxide (a-IGZO)).

At least one of the light blocking electrode 346, the source electrode SE, and the drain electrode DE includes, or is formed of, a same material as that included in the first pixel electrode PE1. For example, the light blocking electrode 346, the source electrode SE, the drain electrode DE, and the first pixel electrode PE1 may include a same conductive material.

For example, the light blocking electrode 346, the source electrode SE, the drain electrode DE, and the first pixel electrode PE1 may include a same semiconductor material and same impurities. An amount of impurities included in the light blocking electrode 346, an amount of impurities included in the source electrode SE, an amount of impurities included in the drain electrode DE, and an amount of impurities included in the first pixel electrode PE1 are substantially the same as one another. As used herein, the amount of impurities refers to an amount of impurities per unit area.

The semiconductor material may be indium gallium zinc oxide (IGZO) or amorphous indium gallium zinc oxide (a-IGZO). In addition, the impurities may be hydrogen ($H_2$). The indium gallium zinc oxide (IGZO) has a high degree of transparency, and exhibits a high degree of electric conductivity by injection of impurities such as hydrogen ($H_2$). That is, in the case that hydrogen ($H_2$) is injected into the indium gallium zinc oxide (IGZO), a density of electrons, and thus the electric conductivity of the indium gallium zinc oxide (IGZO), increases. In addition, even though impurities such as hydrogen ($H_2$) are injected, an inherent transparency of the indium gallium zinc oxide (IGZO) is not degraded.

Each of the light blocking electrode 346, the source electrode SE, the drain electrode DE, and the first pixel electrode PE1 includes a greater amount of impurities than an amount of impurities included in the semiconductor layer 313. In other words, each of the amount of impurities included in the light blocking electrode 346, the amount of impurities included in the source electrode SE, the amount of impurities included in the drain electrode DE, and the amount of impurities included in the first pixel electrode PE1 is greater than the amount of impurities included in the semiconductor layer 313. As used herein, the amount of impurities refers to an amount of impurities per unit area.

In an exemplary embodiment, the semiconductor layer 313 may not include impurities. In other words, the amount of impurities in the semiconductor layer 313 may be substantially 0. Due to a difference in the amount of impurities, the semiconductor layer 313 has different electric characteristics from those of the light blocking electrode 346, the source electrode SE, the drain electrode DE, and the first pixel electrode PE1. For example, each of the light blocking electrode 346, the source electrode SE, the drain electrode DE, and the first pixel electrode PE1 has a higher degree of conductivity than that of the semiconductor layer 313. The light blocking electrode 346, the source electrode SE, the drain electrode DE, and the first pixel electrode PE1 substantially have characteristics of a conductor, and the semiconductor layer 313 has characteristics of a semiconductor.

As illustrated in FIGS. 1 and 3, the light blocking electrode 346 overlaps the data line DL. The light blocking electrode 346 receives a common voltage. The light blocking electrode 346 prevents formation of an electric field between the data line DL and the pixel electrode (e.g., the first, second, and third pixel electrodes PE1, PE2, and PE3). In addition, since the light blocking electrode 346 and the common electrode 330 are equipotential, light transmitted through the liquid crystal layer 333 between the light blocking electrode 346 and the common electrode 330 is blocked by the second polarizer. Accordingly, light leakage is prevented in an area corresponding to the data line DL. In addition, as the light blocking electrode 346 may substitute for a portion of the light blocking layer 376 on the data line DL, in the case that the light blocking electrode 346 is used in the display device, the portion of the light blocking layer 376 on the data line DL may be removed. Accordingly, in the case that the light blocking electrode 346 is provided, an aperture ratio of the pixel may be increased.

As illustrated in FIG. 1, the light blocking electrodes 346 that face one another with the gate line GL therebetween are connected to one another by a connecting electrode 855. The connecting electrode 855 includes a same material as that included in the second pixel electrode PE2 to be described below.

The insulating interlayer 391 is disposed on the semiconductor layer 313. In an exemplary embodiment, although not illustrated, the insulating interlayer 391 is also disposed on the data insulating layer 321.

The insulating interlayer 391 may include silicon nitrides (SiNx) or silicon oxides (SiOx), for example. The insulating interlayer 391 may have a multilayer structure including at least two insulating layers that have different physical properties.

The gate line GL and the gate electrode GE are disposed on the insulating interlayer 391. In such an exemplary embodiment, the gate electrode GE overlaps the semiconductor layer 313. In the case that the unitary source electrode SE, semiconductor layer 313, drain electrode DE, and first pixel electrode PE1 are collectively defined as a multifunctional layer, a portion of the multifunctional layer overlapping the gate electrode GE is defined as the aforementioned semiconductor layer 313.

The insulating interlayer 391 may have a same shape as a shape of the gate line GL and the gate electrode GE. For example, in the case that a configuration including the gate line GL and the gate electrode GE is defined as a gate transmission unit, the insulating interlayer 391 may have a same shape as a shape of the gate transmission unit.

The gate line GL and the gate electrode GE are unitary. For example, the gate electrode GE, as illustrated in FIG. 1, may have a shape protruding toward the third pixel electrode PE3 from the gate line GL.

An end portion of the gate line GL may be connected to another layer or an external driving circuit, and thus the end portion of the gate line GL may have a greater plan-view area than a plan-view area of another portion of the gate line GL.

In an exemplary embodiment, at least one of the gate line GL and the gate electrode GE may include or be formed of aluminum (Al) or alloys thereof, silver (Ag) or alloys thereof, copper (Cu) or alloys thereof, and/or molybdenum (Mo) or alloys thereof. In an alternative exemplary embodiment, at least one of the gate line GL and the gate electrode GE may include or be formed of one of chromium (Cr), tantalum (Ta), and titanium (Ti). In an exemplary embodiment, at least one of the gate line GL and the gate electrode GE may have a multilayer structure including at least two conductive layers that have different physical properties from one another.

As illustrated in FIGS. 2 and 3, the passivation layer 323 is disposed on the data insulating layer 321, the light blocking electrode 346, the source electrode SE, the drain electrode DE, the first pixel electrode PE1, and the gate electrode GE. Although not illustrated, the passivation layer 323 is also disposed on the gate line GL. The passivation layer 323 is disposed over substantially the entire surface of the first substrate 301 including at least the data insulating layer 321, the light blocking electrode 346, the source electrode SE, the drain electrode DE, the first pixel electrode PE1, the gate electrode GE, and the gate line GL.

The passivation layer 323 has a data contact hole 901, a source contact hole 902, and a drain contact hole 903. The data contact hole 901 of the passivation layer 323 is defined above the data line DL, the source contact hole 902 is defined above the source electrode SE, and the drain contact hole 903 is defined above the drain electrode DE.

The passivation layer 323 may include an inorganic insulating material such as silicon nitrides (SiNx) or silicon oxides (SiOx). In an exemplary embodiment, the passivation layer 323 may include an inorganic insulating material, and in such an exemplary embodiment, an inorganic insulating material having photosensitivity and having a dielectric constant of about 4.0 may be used. In an exemplary embodiment, the passivation layer 323 may have a double-layer structure including a lower inorganic layer and an upper organic layer. The passivation layer 323 may have a thickness greater than or equal to about 5000 Å, for example in a range of about 6000 Å to about 8000 Å.

The connecting electrode 814, the second pixel electrode PE2, and the third pixel electrode PE3 are disposed on the passivation layer 323.

The connecting electrode 814 connects the data line DL and the source electrode SE through the data contact hole 901 and the source contact hole 902.

The second pixel electrode PE2 is connected to the drain electrode DE through the drain contact hole 903 of the passivation layer 323. The second pixel electrode PE2 overlaps the first pixel electrode PE1.

The third pixel electrode PE3 does not physically contact another conductor. For example, the third pixel electrode PE3 is disposed above the passivation layer 323 in a floating state. The third pixel electrode PE3 is disposed on a same layer as a layer on which the second pixel electrode PE2 is disposed. The third pixel electrode PE3 overlaps the first pixel electrode PE1.

In an exemplary embodiment, the second pixel electrode PE2 and the third pixel electrode PE3 are disposed on a different layer from a layer on which the light blocking electrode 346 is disposed. Accordingly, the second pixel electrode PE2 and the third pixel electrode PE3 may further extend onto the data line DL. In such an exemplary embodiment, plan-view areas of the second pixel electrode PE2 and the third pixel electrode PE3 further increase such that an aperture ratio of a pixel may increase.

Hereinafter, the first pixel electrode PE1, the second pixel electrode PE2, and the third pixel electrode PE3 will be described in further detail.

Figure 4:
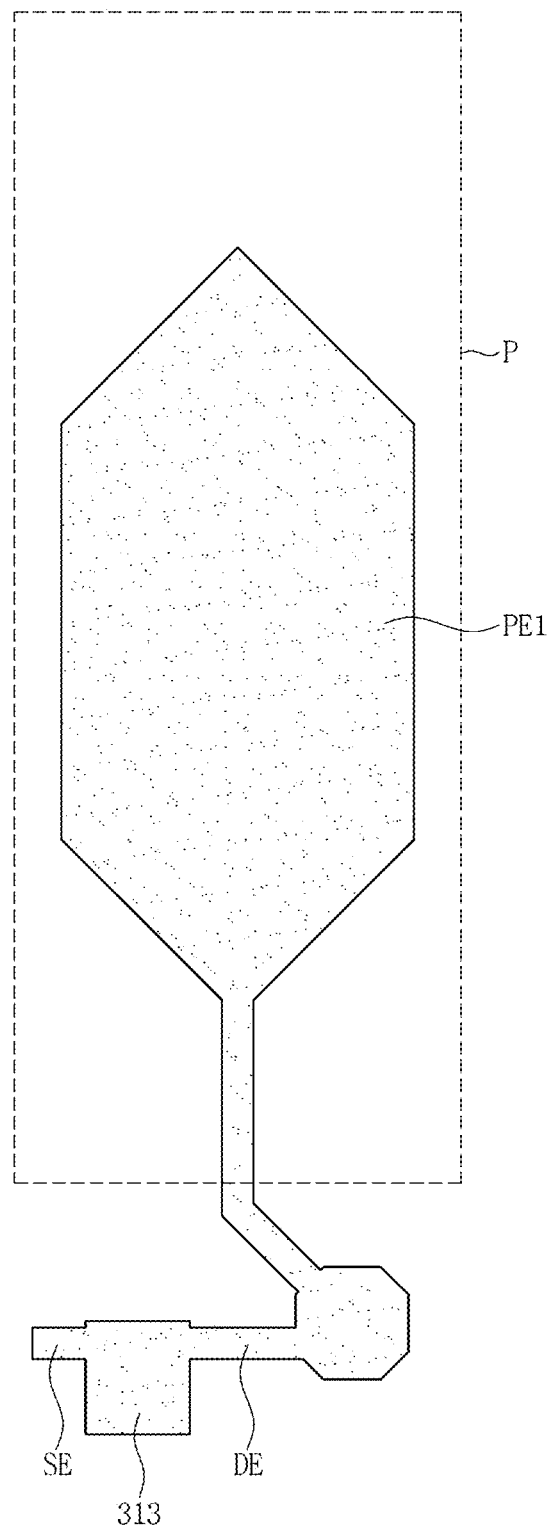
FIG. 4 is a view separately illustrating a source electrode, a semiconductor layer, a drain electrode, and a first pixel electrode of FIG. 1.

FIG. 4 is a view separately illustrating the source electrode SE, the semiconductor layer 313, the drain electrode DE, and the first pixel electrode PE1 of FIG. 1.

The first pixel electrode PE1 is disposed in a pixel area P. For example, the first pixel electrode may be disposed in a central portion of the pixel area P.

As illustrated in FIG. 4, the first pixel electrode PE1 may have a hexagonal shape.

Figure 5:
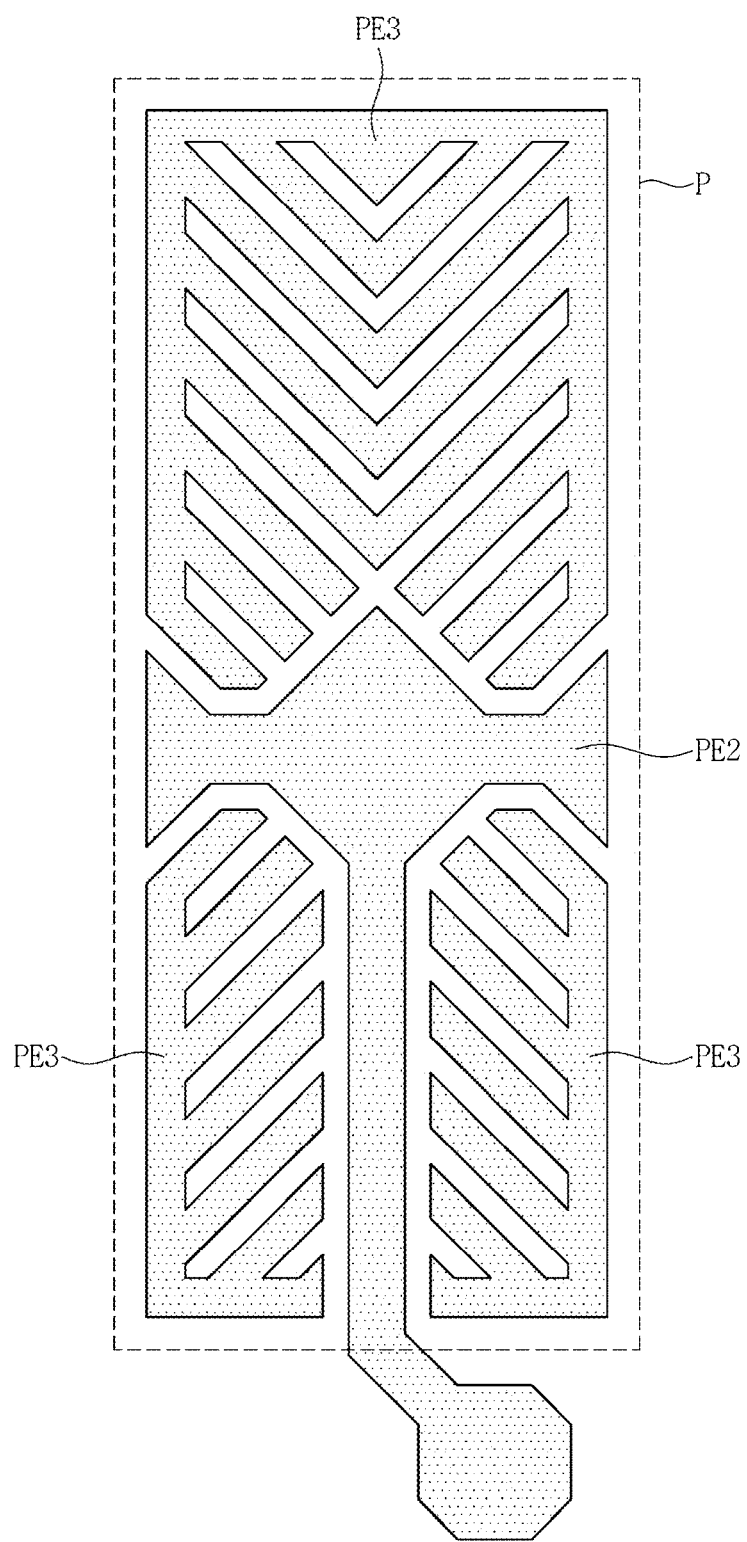
FIG. 5 is a view separately illustrating a second pixel electrode and a third pixel electrode of FIG. 1.
Figure 6:
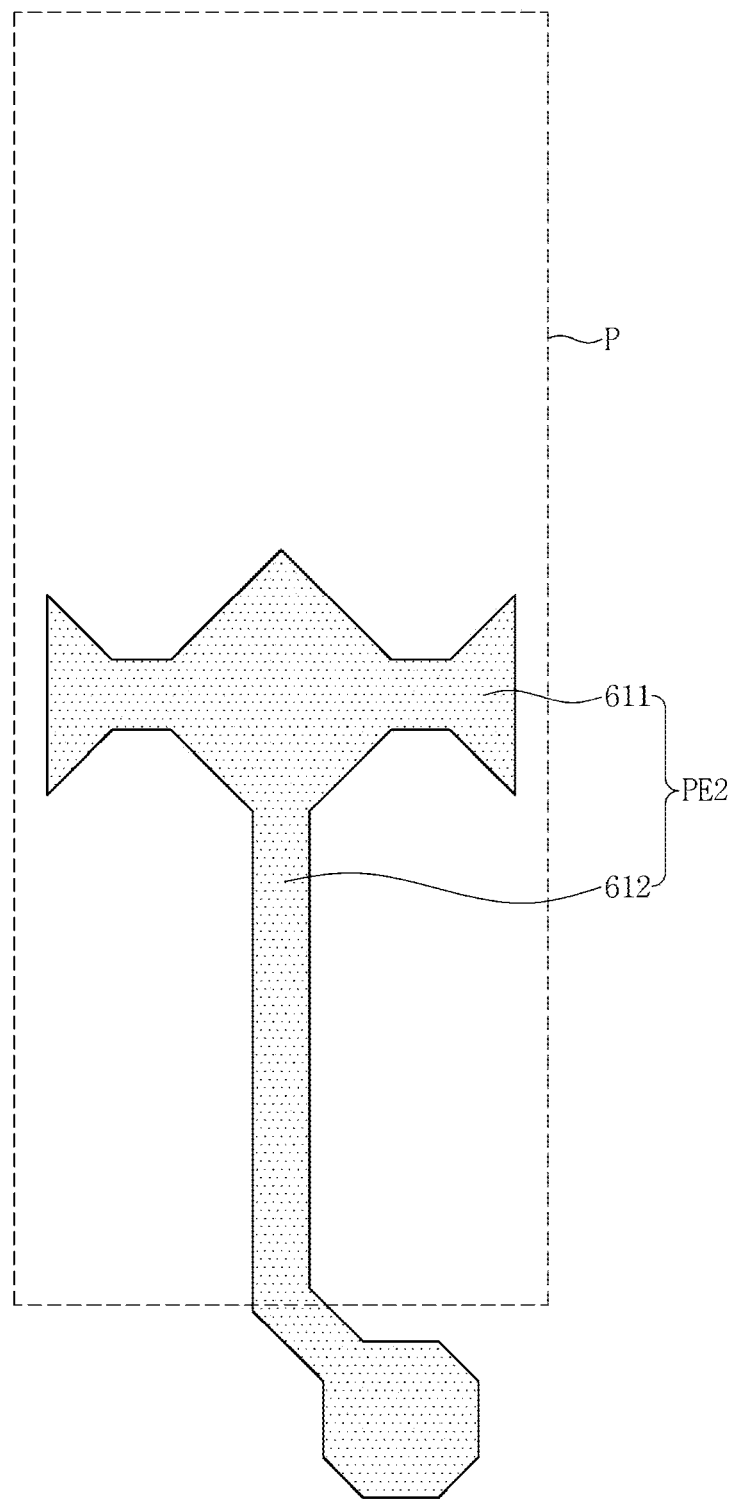
FIG. 6 is a view separately illustrating the second pixel electrode of FIG. 5.

FIG. 5 is a view separately illustrating the second pixel electrode PE2 and the third pixel electrode PE3 of FIG. 1; FIG. 6 is a view separately illustrating the second pixel electrode PE2 of FIG. 5; and FIG. 7 is a view separately illustrating the third pixel electrode PE3 of FIG. 5.

The second pixel electrode PE2 is disposed in the pixel area P. For example, the second pixel electrode PE2 may be disposed in a central portion of the pixel area P. As can be seen with reference to FIG. 4, a portion of the second pixel electrode PE2 overlaps a portion of the first pixel electrode PE1.

In an exemplary embodiment, as illustrated in FIGS. 5 and 6, the second pixel electrode PE2 may have a general cross or "T" shape.

The second pixel electrode PE2 may include a horizontal portion 611 and a vertical portion 612. The horizontal portion 611 is disposed in a central portion of the pixel area P, and the vertical portion 612 extends toward a lower portion of the pixel area P from a central portion of the horizontal portion 611.

The third pixel electrode PE3 is disposed in the pixel area P. For example, the third pixel electrode PE3 may be disposed at an edge portion or portions of the pixel area P. As can be seen with reference to FIG. 4, a portion of the third pixel electrode PE3 overlaps a portion of the first pixel electrode PE1.

As illustrated in FIGS. 5 and 7, the third pixel electrode PE3 includes a plurality of floating electrodes 701, 702, and 703 that are separated from one another, i.e. not connected to/electrically isolated from each other. For example, the third pixel electrode PE3 may include first, second, and third floating electrodes 701, 702, and 703.

The first floating electrode 701 is disposed in an upper portion of the pixel area P.

The first floating electrode 701 includes a stem electrode 711 and branch electrodes 701a and 701b.

The stem electrode 711 of the first floating electrode 701 may have an inverted U-like shape.

The branch electrodes 701a and 701b of the first floating electrode 701 include at least one first branch electrode 701a and at least one second branch electrode 701b extending from the stem electrode 701 in different directions, respectively.

At least one of the first branch electrodes 701a and at least one of the second branch electrodes 701b included in the first floating electrode 701 may be connected to one another.

The first branch electrode 701a and the second branch electrode 701b of the first floating electrode 701 both overlap the first pixel electrode PE1.

The second floating electrode 702 is disposed in a lower left portion of the pixel area P.

The second floating electrode 702 includes a stem electrode 712 and at least one branch electrode 701c.

The stem electrode 712 of the second floating electrode 702 may have an L-like shape.

At least one branch electrode 701c of the second floating electrode 702 overlaps the first pixel electrode PE1.

The third floating electrode 703 is disposed in a lower right portion of the pixel area P.

The third floating electrode 703 includes a stem electrode 713 and at least one branch electrode 701d.

The stem electrode 713 may have a shape that is symmetric to the stem electrode 712 of the second floating electrode 702 with respect to the vertical portion 612 of the second pixel electrode PE2.

At least one branch electrode 701d of the third floating electrode 703 overlaps the first pixel electrode PE1.

The light blocking layer 376 is disposed on the second substrate 302. The light blocking layer 376 has an aperture at a portion corresponding to the pixel area P and the data line DL.

The color filter 354 is also disposed on the second substrate 302. In such an exemplary embodiment, the color filter 354 is disposed in an area of the aperture of the light blocking layer 376 corresponding to the pixel area P. In addition, an edge portion of the color filter 354 is disposed on the light blocking layer 376, i.e. the color filter 354 partially overlaps the light blocking layer 376.

The overcoat layer 722 is disposed on the light blocking layer 376 and the color filter 354. The overcoat layer 722 may be disposed over substantially an entire surface of the second substrate 302 including the light blocking layer 376. The overcoat layer 722 is configured to significantly reduce a height difference among elements between the overcoat layer 722 and the second substrate 302, e.g., elements of the second substrate 302 such as the light blocking layer 376 and the color filter 354 described above. The overcoat layer 722 may be omitted from the display device.

The common electrode 330 is disposed on the overcoat layer 722. The common electrode 330 may be disposed over substantially the entire surface of the second substrate 302 including the overcoat layer 722. The common electrode 330 receives a common voltage.

The liquid crystal layer 333 between the first substrate 301 and the second substrate 302 includes liquid crystal molecules. The liquid crystal molecules may have a negative dielectric constant and may include homeotropic liquid crystal molecules.

FIGS. 8A, 8B, 8C, 8D, 8E, 8F, 8G, 8H, 8I, 9A, 9B, 9C, 9D, 9E, 9F, 9G, and 9H are cross-sectional views illustrating a process of manufacturing display devices of FIGS. 1, 2, and 3. FIGS. 8A, 8B, 8C, 8D, 8E, 8F, 8G, 8H, and 8I are cross-sectional views illustrating a process of manufacturing the display device of FIGS. 1 and 2, and FIGS. 9A, 9B, 9C, 9D, 9E, 9F, 9G, and 9H are cross-sectional views illustrating a process of manufacturing the display device of FIGS. 1 and 3.

Although not illustrated, a first conductive layer is deposited over substantially an entire surface of a first substrate 301. The first conductive layer may be deposited using a physical vapor deposition (PVD) method such as sputtering. The first conductive layer may include a material included in the aforementioned data line.

Figure 8A:
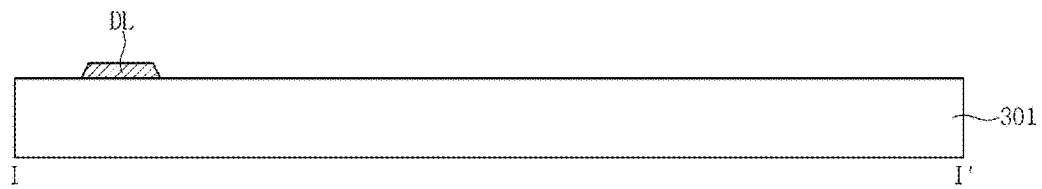
FIGS. 8A, 8B, 8C, 8D, 8E, 8F, 8G, 8H, 8I, 9A, 9B, 9C, 9D, 9E, 9F, 9G, and 9H are cross-sectional views illustrating a process of manufacturing the display device of FIGS. 1, 2, and 3.
Figure 9A:
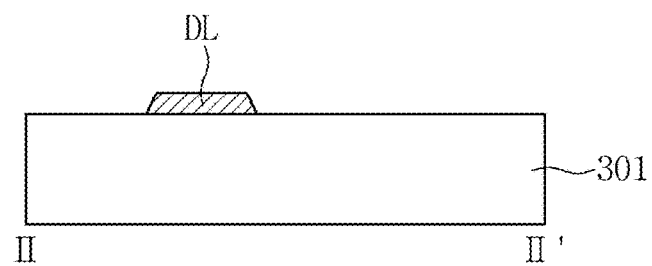

Subsequently, the first conductive layer is patterned through a photolithography process and an etching process such that a data line DL is formed on the first substrate 301 as illustrated in FIGS. 8A and 9A. The first conductive layer may be removed by a wet-etching method using an etchant.

Figure 8B:
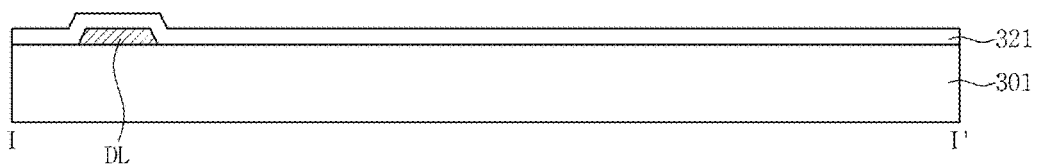
Figure 9B:
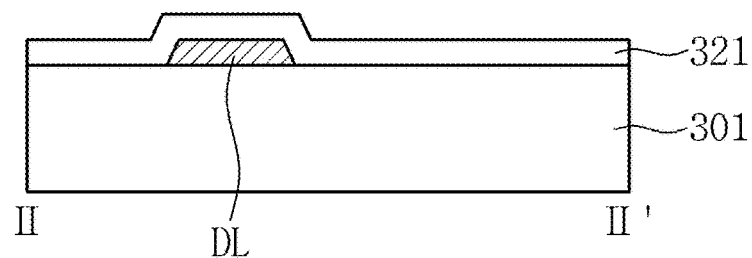

Next, as illustrated in FIGS. 8B and 9B, a data insulating layer 321 is deposited over substantially the entire surface of the first substrate 301 including the data line DL. The data insulating layer 321 may be deposited using a chemical vapor deposition (CVD) method. The data insulating layer 321 may include a material included in the aforementioned data insulating layer 321.

Subsequently, although not illustrated, a semiconductor material is deposited over substantially the entire surface of the first substrate 301 including the data insulating layer 321. The semiconductor material may be deposited via a chemical vapor deposition (CVD) method. The semiconductor material may be indium gallium zinc oxide (IGZO) or amorphous indium gallium zinc oxide (a-IGZO).

Figure 8C:
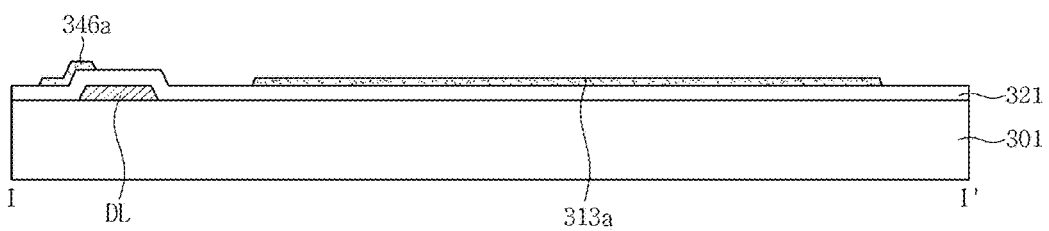
Figure 9C:
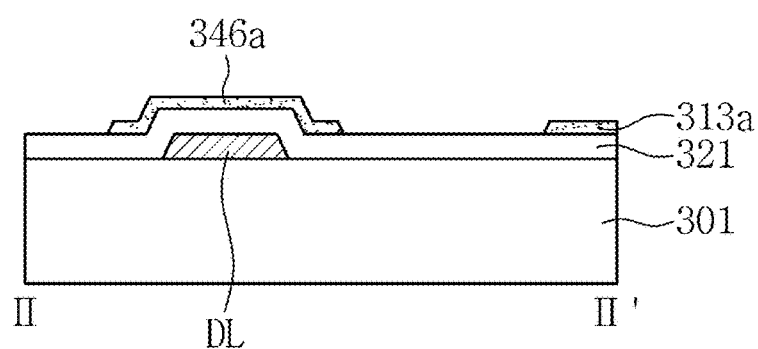

The semiconductor material is then patterned through a photolithography process and an etching process such that a first semiconductor pattern 313a and a second semiconductor pattern 346a that are separated from each other are formed as illustrated in FIGS. 8C and 9C. The first semiconductor pattern 313a is disposed on the data insulating layer 321, and the second semiconductor pattern 346a is disposed on the data insulating layer 321 to overlap the data line DL. The semiconductor material may be removed by a dry-etching method using an etching gas.

Figure 8D:
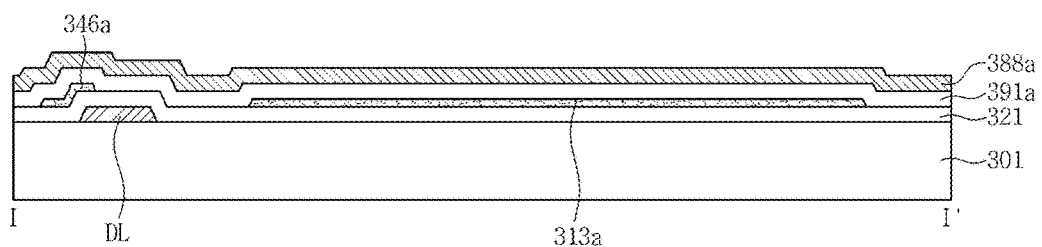
Figure 9D:
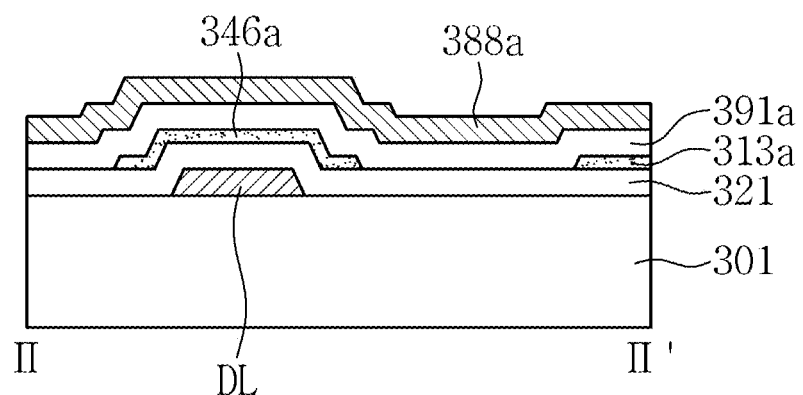

Subsequently, as illustrated in FIGS. 8D and 9D, an insulating layer 391a is deposited over substantially the entire surface of the first substrate 301 including the first and second semiconductor patterns 313a and 346a. Next, a second conductive layer 388a is deposited over substantially the entire surface of the first substrate 301 including the insulating layer 391a.

Figure 8E:
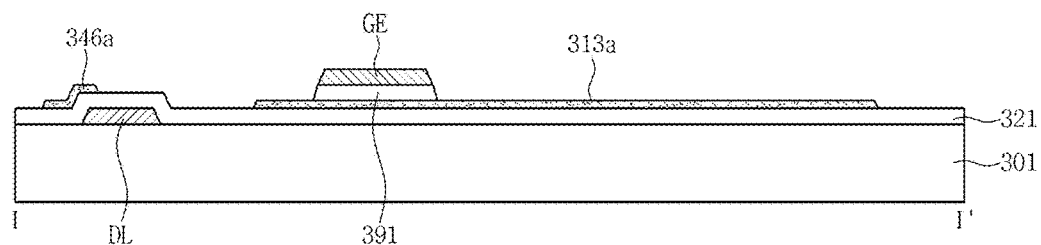
Figure 9E:
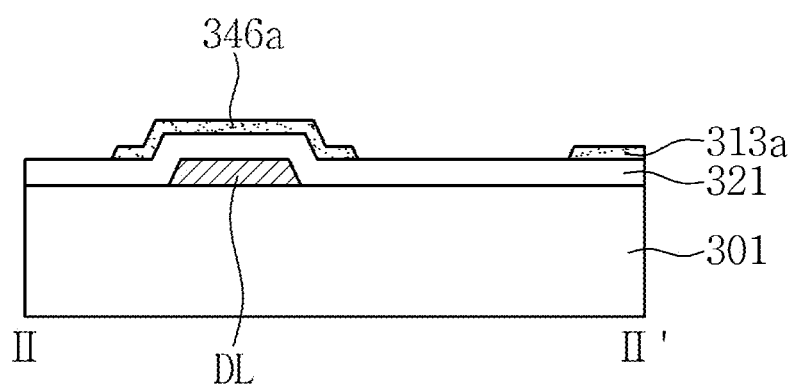

The second conductive layer 388a and the insulating layer 391a are then sequentially patterned through a photolithography process and an etching process, such that an insulating interlayer 391 and a gate electrode GE are formed as illustrated in FIGS. 8E and 9E. The second conductive layer 388a and the insulating layer 391a are patterned using the same mask.

The insulating interlayer 391 is disposed on the first semiconductor pattern 313a, and the gate electrode GE is disposed on the insulating interlayer 391 to have substantially a same shape as that of the insulating interlayer 391. The second conductive layer 388a may be removed by a wet-etching method, and the insulating layer 391a may be removed by a dry-etching method.

In an exemplary embodiment, although not illustrated, through the patterning process of the second conductive layer 388a and the insulating layer 391a, another insulating interlayer (hereinafter, a second insulating interlayer) is further formed on the data insulating layer 321, and a gate line GL is formed on the second insulating interlayer to have substantially a same shape as that of the second insulating interlayer.

Figure 8F:
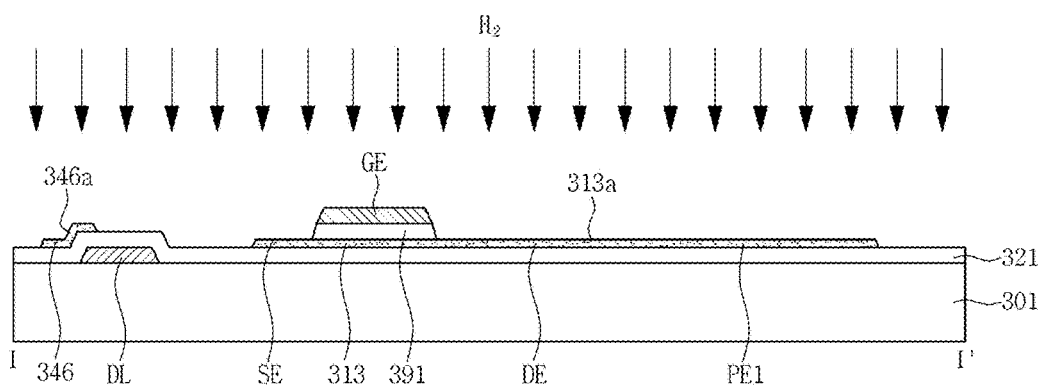
Figure 9F:
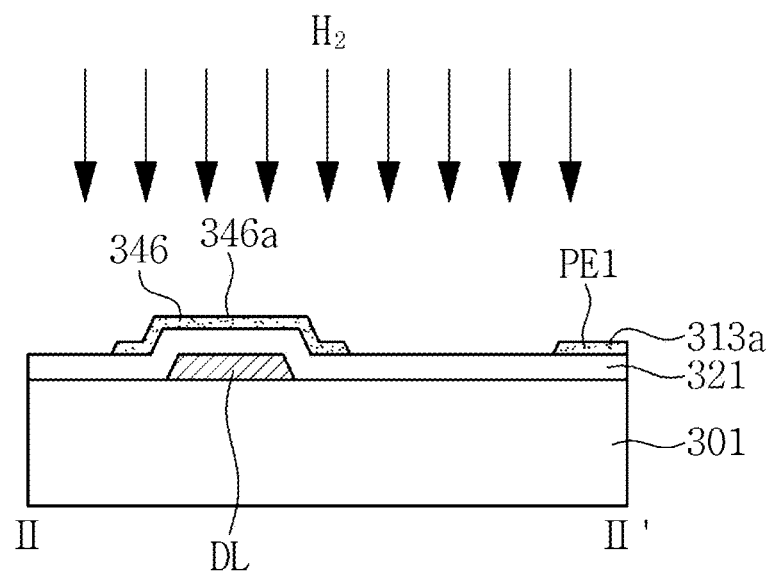

Subsequently, as illustrated in FIGS. 8F and 9F, the gate electrode GE and the insulating interlayer 391 are used as a mask, while impurities (or impurity ions) are injected (or doped) into the first semiconductor pattern 313a and the second semiconductor pattern 346a. The impurities may be injected into the first semiconductor pattern 313a and the second semiconductor pattern 346a through a plasma scheme. The impurities may use hydrogen ($H_2$). In such an exemplary embodiment, the impurities may be injected into the first semiconductor pattern 313a in a selective manner (or partially) due to the gate electrode GE and the insulating interlayer 391. The impurities are injected into substantially an entire surface of the second semiconductor pattern 346a.

Through the impurity injection process, a source electrode SE, a semiconductor layer 313, a drain electrode DE, a first pixel electrode PE1, and a light blocking electrode 346 are formed. That is, a portion of the first semiconductor pattern 313a that overlaps the gate electrode GE and the insulating interlayer 391 and is not injected with the impurities functions as the semiconductor layer 313, and another portion of the first semiconductor pattern 313a injected with the impurities is metalized to function as the source electrode SE, the drain electrode DE, and the first pixel electrode PE1. In an exemplary embodiment, through the impurity injection process, the second semiconductor pattern 346a is metalized to function as the light blocking electrode 346. As such, through a single mask process and an impurity injection process, the light blocking electrode 346, the source electrode SE, the semiconductor layer 313, the drain electrode DE, and the first pixel electrode PE1 may be simultaneously formed.

Figure 8G:
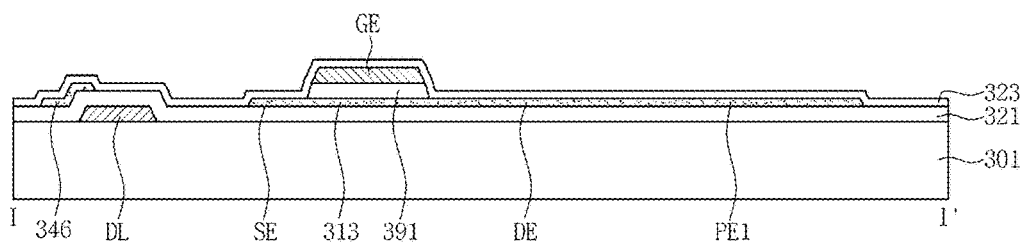
Figure 9G:
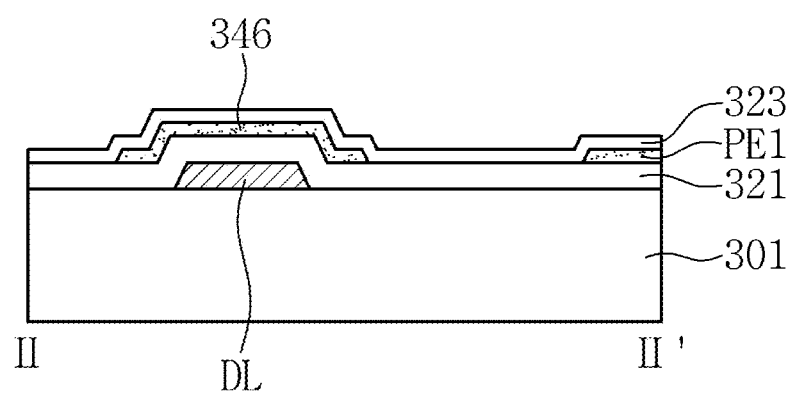

Next, as illustrated in FIGS. 8G and 9G, a passivation layer 323 is deposited over substantially the entire surface of the first substrate 301 including the source electrode SE, the semiconductor layer 313, the drain electrode DE, the first pixel electrode PE1, and the light blocking electrode 346. The passivation layer 323 may include a material included in the aforementioned passivation layer 323.

Figure 8H:
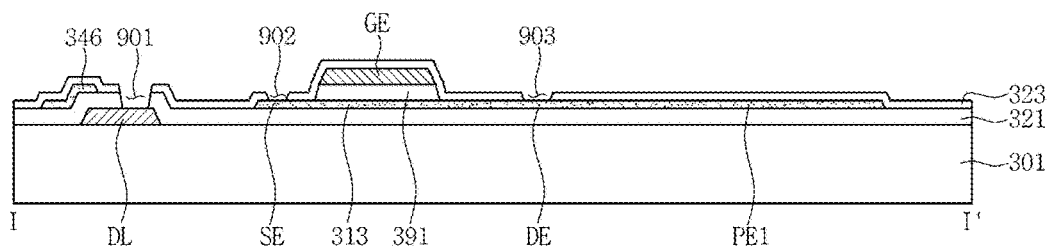

Subsequently, the passivation layer 323 and the data insulating layer 321 are removed in a selective manner through a photolithography process and an etching process such that a data contact hole 901, a source contact hole 902, and a drain contact hole 903 are defined as illustrated in FIG. 8H. The data contact hole 901 extends through each of the passivation layer 323 and the data insulating layer 321, and the source contact hole 902 and the drain contact hole 903 extend through the passivation layer 323. The data line DL is exposed through the data contact hole 901, the source electrode SE is exposed through the source contact hole 902, and the drain electrode DE is exposed through the drain contact hole 903.

Subsequently, although not illustrated, a transparent metal layer is deposited over substantially the entire surface of the first substrate 301 including the data contact hole 901, the source contact hole 902, the drain contact hole 903, and the passivation layer 323. The transparent metal layer may include a material included in the second pixel electrode PE2.

Figure 8I:
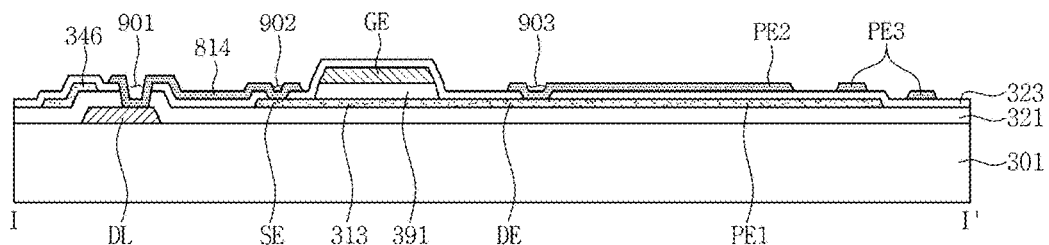
Figure 9H:
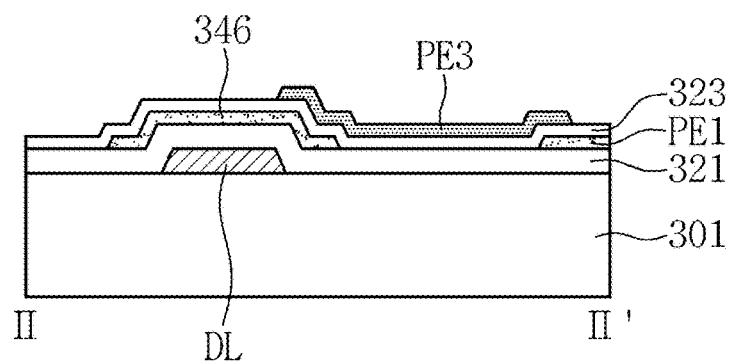

The transparent metal layer is then patterned through a photolithography process and an etching process such that a second pixel electrode PE2, a third pixel electrode PE3, and a connecting electrode 814 are formed as illustrated in FIGS. 8I and 9H. The connecting electrode 814 electrically connects the data line DL and the source electrode SE through the data contact hole 901 and the source contact hole 902. The second pixel electrode PE2 is electrically connected to the drain electrode DE through the drain contact hole 903.

Figure 10:
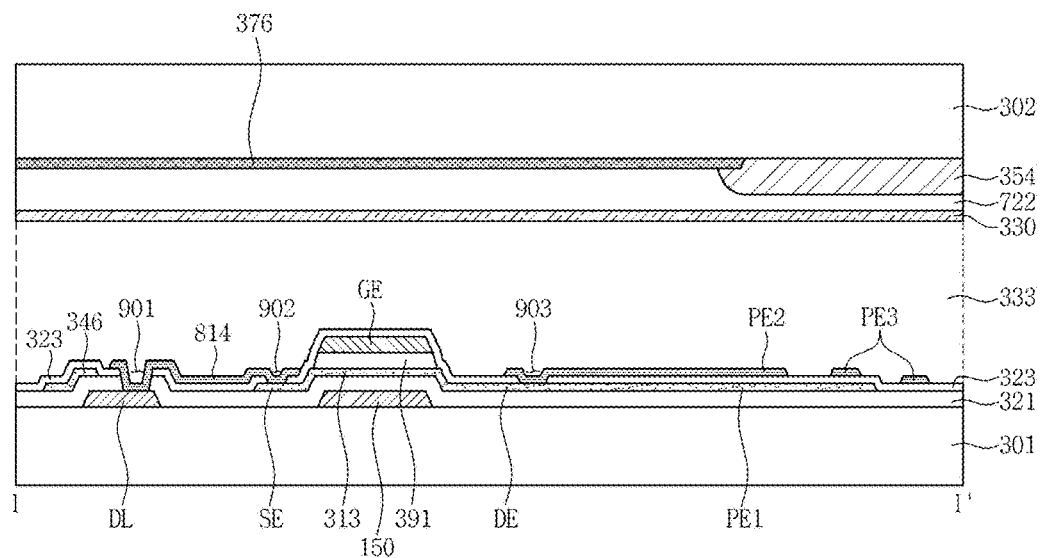
FIG. 10 is a cross-sectional view illustrating another exemplary embodiment taken along line I-I' of FIG. 1.

FIG. 10 is a cross-sectional view illustrating another exemplary embodiment taken along line I-I' of FIG. 1.

The display device illustrated in FIG. 1 may further include a light blocking layer 150, as illustrated in FIG. 10. The light blocking layer 150 is disposed between a first substrate 301 and a semiconductor layer 313.

In the case that the display device is an LCD device including a backlight, light provided from the backlight may be applied to the semiconductor layer 313 through the first substrate 301. In such an exemplary embodiment, the semiconductor layer 313 can be activated, and thus photo-leakage current may occur.

The light blocking layer 150 prevents light provided from the backlight from reaching the semiconductor layer 313, and thus prevents photo-leakage current may from being generated. The light blocking layer 150 may include a same material as that included in the data line DL.

Figure 11:
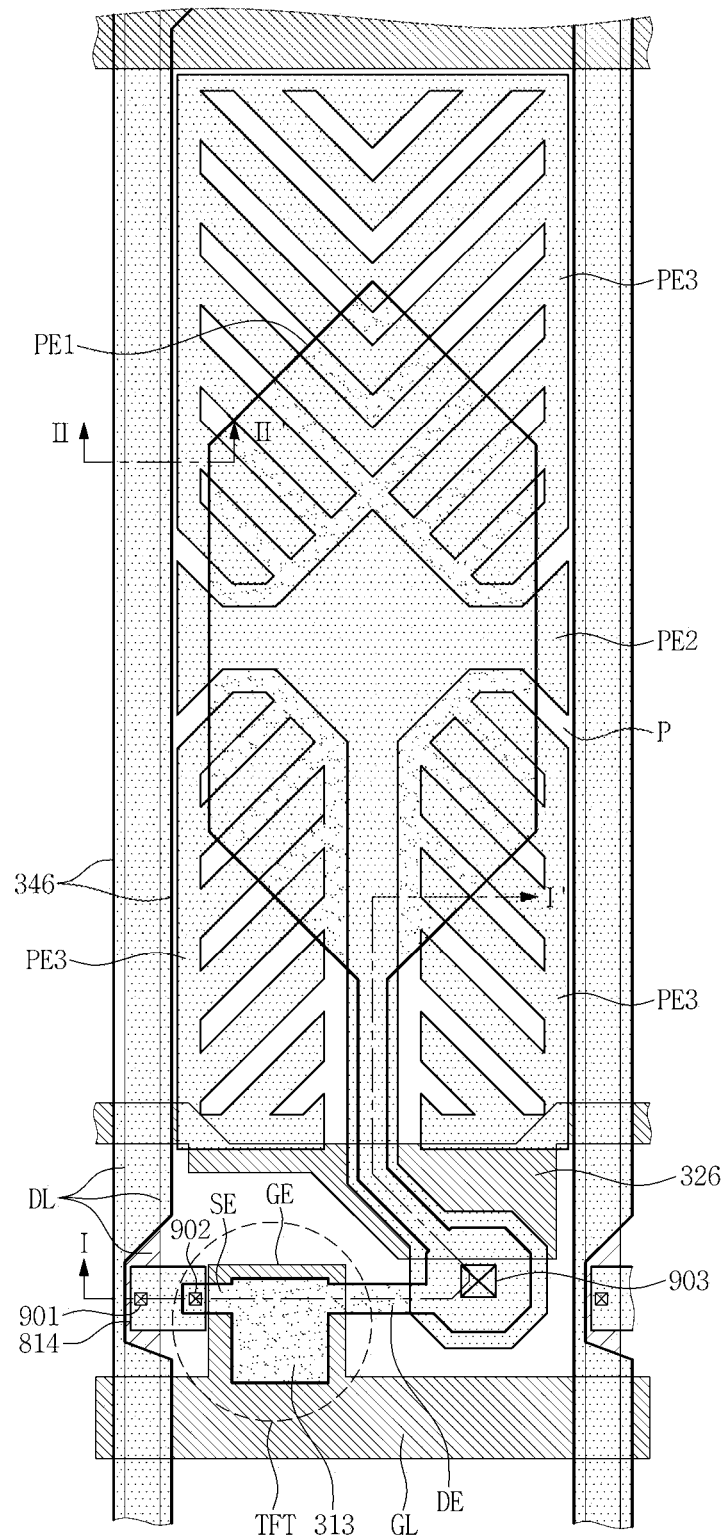
FIG. 11 is a plan view illustrating another exemplary embodiment of the display device.
Figure 12:
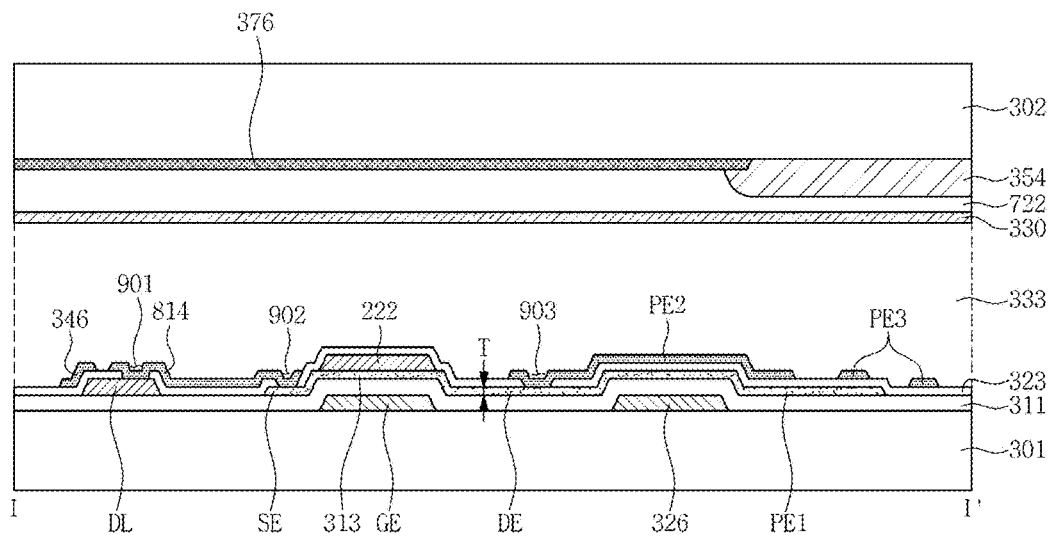
FIG. 12 is a cross-sectional view illustrating an exemplary embodiment taken along line I-I' of FIG. 11.

FIG. 11 is a plan view illustrating another exemplary embodiment of the display device; FIG. 12 is a cross-sectional view illustrating an exemplary embodiment taken along line I-I' of FIG. 11; and FIG. 13 is a cross-sectional view illustrating an exemplary embodiment taken along line II-II' of FIG. 11.

Figure 13:
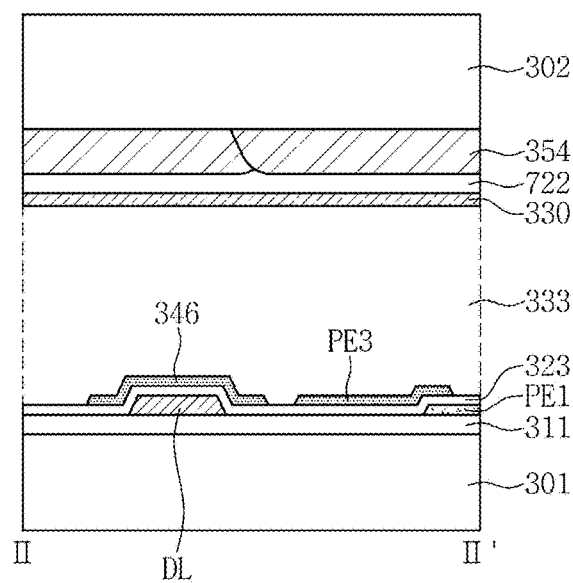
FIG. 13 is a cross-sectional view illustrating an exemplary embodiment taken along line II-II' of FIG. 11.

As illustrated in FIGS. 11, 12, and 13, the display device includes a first substrate 301, a second substrate 302, a thin film transistor TFT, a storage electrode 326, a first pixel electrode PE1, a second pixel electrode PE2, a third pixel electrode PE3, a light blocking electrode 346, a gate insulating layer 311, a passivation layer 323, a light blocking layer 376, a color filter 354, an overcoat layer 722, a common electrode 330, and a liquid crystal layer 333. Herein, the overcoat layer 722 may be omitted from the display device.

As illustrated in FIGS. 11 and 12, the thin film transistor (TFT) includes a gate electrode GE, a semiconductor layer 313, a source electrode SE, and a drain electrode DE.

In an exemplary embodiment, although not illustrated, the display device may further include at least one of the first polarizer and the second polarizer described above.

The gate electrode GE, the gate line GL, and the storage electrode 326 are disposed on the first substrate 301.

The gate electrode GE and the gate line GL are unitary. As illustrated in FIG. 11, the gate electrode GE may have a shape protruding toward the storage electrode 326 from the gate line GL.

An end portion of the gate line GL may be connected to another layer or to an external driving circuit, and thus the end portion of the gate line GL may have a greater plan-view area than a plan-view area of another portion of the gate line GL. The gate line GL and the gate electrode GE illustrated in FIG. 11 may include a same material as that included in the gate line GL and the gate electrode GE of FIG. 1.

The storage electrode 326 overlaps at least one of the first pixel electrode PE1, the second pixel electrode PE2, and the third pixel electrode PE3. A storage capacitor (e.g., an auxiliary storage capacitor) is formed between those portions of the storage electrode 326 and the pixel electrode (at least one of the first, second, and third pixel electrodes PE1, PE2, and PE3) that overlap one another. The storage electrode 326 may include a same material as that included in the gate line GL.

As illustrated in FIG. 12, the gate insulating layer 311 is disposed on the gate electrode GE, the gate line GL, and the storage electrode 326. The gate insulating layer may be disposed over substantially the entire surface of the first substrate 301, including the gate electrode GE, the gate line GL, and the storage electrode 326.

The gate insulating layer 311 may include silicon nitrides (SiNx) or silicon oxides (SiOx), for example. The gate insulating layer 311 may have a multilayer structure including at least two insulating layers that have different physical properties.

The source electrode SE, the semiconductor layer 313, the drain electrode DE, the first pixel electrode PE1, and the data line DL are disposed on the gate insulating layer 311. In such an exemplary embodiment, the semiconductor layer 313 overlaps the gate electrode GE.

As illustrated in FIGS. 11 and 12, the semiconductor layer 313 is disposed between the source electrode SE and the drain electrode DE in a plan view.

At least one of the source electrode SE, the semiconductor layer 313, and the drain electrode DE is disposed on a same layer as a layer on which the first pixel electrode PE1 is disposed. For example, as illustrated in FIG. 12, the source electrode SE, the semiconductor layer 313, the drain electrode DE, and the first pixel electrode PE1 are all disposed on the gate insulating layer 311.

The source electrode SE, the semiconductor layer 313, the drain electrode DE, and the first pixel electrode PE1 are a single unitary and continuous structure. In other words, the source electrode SE, the semiconductor layer 313, the drain electrode DE, and the first pixel electrode PE1 are formed into a unitary structure without an interface thereamong. That is, a physical interface between the source electrode SE and the semiconductor layer 313, a physical interface between the semiconductor layer 313 and the drain electrode DE, and a physical interface between the drain electrode DE and the first pixel electrode PE1 are all absent.

The source electrode SE, the semiconductor layer 313, the drain electrode DE, and the first pixel electrode PE1 all have substantially a same thickness T, due to the fact that the source electrode SE, the semiconductor layer 313, the drain electrode DE, and the first pixel electrode PE1 are all manufactured from a same semiconductor material (e.g., Indium gallium zinc oxide (IGZO)).

At least one of the source electrode SE and the drain electrode DE includes or is formed of a same material as that included in the first pixel electrode PE1. For example, the source electrode SE, the drain electrode DE, and the first pixel electrode PE1 may include a same conductive material.

In some embodiments, the source electrode SE, the drain electrode DE, and the first pixel electrode PE1 may include a same semiconductor material and same impurities. An amount of impurities included in the source electrode SE, an amount of impurities included in the drain electrode DE, and an amount of impurities included in the first pixel electrode PE1 are substantially the same as one another. As used herein, the amount of impurities refers to an amount of impurities per unit area. The semiconductor material may be, for example, indium gallium zinc oxide (IGZO) or amorphous indium gallium zinc oxide (a-IGZO). In addition, the impurities may be, for example, hydrogen ($H_2$).

Each of the source electrode SE, the drain electrode DE, and the first pixel electrode PE1 includes a greater amount of impurities than an amount of impurities included in the semiconductor layer 313. In other words, each of the amount of impurities included in the source electrode SE, the amount of impurities included in the drain electrode DE, and the amount of impurities included in the first pixel electrode PE1 is greater than the amount of impurities included in the semiconductor layer 313. As used herein, the amount of impurities refers to an amount of impurities per unit area.

In an exemplary embodiment, the semiconductor layer 313 may not include impurities. In other words, the amount of impurities of the semiconductor layer 313 may be substantially 0. Due to a difference in amounts of impurities, the semiconductor layer 313 has different electric characteristics from those of the source electrode SE, the drain electrode DE, and the first pixel electrode PE1. For example, each of the source electrode SE, the drain electrode DE, and the first pixel electrode PE1 has a higher degree of conductivity than that of the semiconductor layer 313. The source electrode SE, the drain electrode DE, and the first pixel electrode PE1 may thus substantially have characteristics of a conductor, and the semiconductor layer 313 may substantially have characteristics of a semiconductor.

The data line DL illustrated in FIG. 11 may include a same material as that included in the data line DL illustrated in FIG. 1.

As illustrated in FIG. 12, a masking pattern 222 is disposed on the semiconductor layer 313. In the case that the unitary source electrode SE, the semiconductor layer 313, the drain electrode DE, and the first pixel electrode PE1 are collectively defined as a multifunctional layer, a portion of the multifunctional layer overlapping the masking pattern 222 is defined as the aforementioned semiconductor layer 313. That is, the masking pattern 222 overlaps the semiconductor layer 313.

The masking pattern 222 may include a same material as that included in the data line DL. In an alternative exemplary embodiment, the masking pattern 222 may include a same material as that included in one of the gate insulating layer 311, the data insulating layer 321, and the passivation layer 323.

As illustrated in FIGS. 12 and 13, the passivation layer 323 is disposed on the gate insulating layer 311, the source electrode SE, the drain electrode DE, the first pixel electrode PE1, the data line DL, and the masking pattern 222. The passivation layer 323 is disposed over substantially an entire surface of the first substrate 301 including the gate insulating layer 311, the source electrode SE, the drain electrode DE, the first pixel electrode PE1, the data line DL, and the masking pattern 222.

The passivation layer 323 has a data contact hole 901, a source contact hole 902, and a drain contact hole 903. The data contact hole 901 is positioned above the data line DL, the source contact hole 902 is positioned above the source electrode SE, and the drain contact hole 903 is positioned above the drain electrode DE.

The passivation layer 323 illustrated in FIG. 12 may include a same material as that included in the passivation layer 323 illustrated in FIG. 2.

The light blocking electrode 346, the connecting electrode 814, the second pixel electrode PE2, and the third pixel electrode PE3 are disposed on the passivation layer 323.

As illustrated in FIGS. 11 and 13, the light blocking electrode 346 overlaps the data line DL. The light blocking electrode 346 receives a common voltage. The light blocking electrode 346 prevents formation of an electric field between the data line DL and the pixel electrode (e.g., the first, second, and third pixel electrodes PE1, PE2, and PE3), and prevents light leakage in an area corresponding to the data line DL.

The connecting electrode 814 connects the data line DL and the source electrode SE through the data contact hole 901 and the source contact hole 902.

The second pixel electrode PE2 is connected to the drain electrode DE through the drain contact hole 903. The second pixel electrode PE2 overlaps the first pixel electrode PE1.

The third pixel electrode PE3 does not contact another conductor physically. For example, the third pixel electrode PE3 is disposed above the passivation layer 323 in a floating state. The third pixel electrode PE3 is disposed on a same layer as a layer on which the second pixel electrode PE2 is disposed. The third pixel electrode PE3 overlaps the first pixel electrode PE1.

Herein, the first, second, and third pixel electrodes PE1, PE2, and PE3 illustrated in FIG. 11 are the same as the first, second, and third pixel electrodes PE1, PE2, and PE3 illustrated in FIG. 1, and thus descriptions pertaining thereto will make reference to FIGS. 1, 4, 5, 6, and 7 and the related descriptions.

FIGS. 14A, 14B, 14C, 14D, 14E, 14F, 14G, 14H, 15A, 15B, 15C, 15D, 15E, 15F, and 15G are cross-sectional views illustrating a process of manufacturing the display device of FIGS. 11, 12, and 13. Herein, FIGS. 14A, 14B, 14C, 14D, 14E, 14F, 14G, and 14H are cross-sectional views illustrating a process of manufacturing the display device of FIGS. 11 and 12, and FIGS. 15A, 15B, 15C, 15D, 15E, 15F, and 15G are cross-sectional views illustrating a process of manufacturing the display device of FIGS. 11 and 13.

Although not illustrated, a first conductive layer is deposited over substantially an entire surface of a first substrate 301. The first conductive layer may be deposited using a physical vapor deposition (PVD) method such as sputtering. The first conductive layer may include a material included in the aforementioned gate line GL.

Figure 14A:
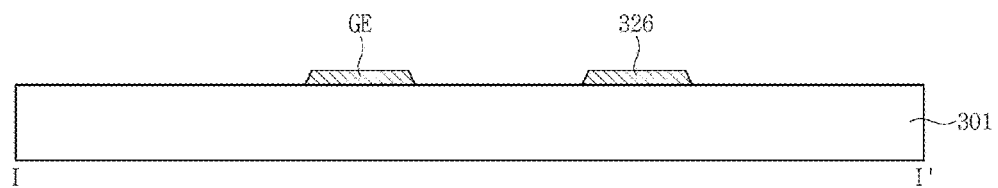
FIGS. 14A, 14B, 14C, 14D, 14E, 14F, 14G, 14H, 15A, 15B, 15C, 15D, 15E, 15F, and 15G are cross-sectional views illustrating a process of manufacturing the display device of FIGS. 11, 12, and 13.
Figure 15A:
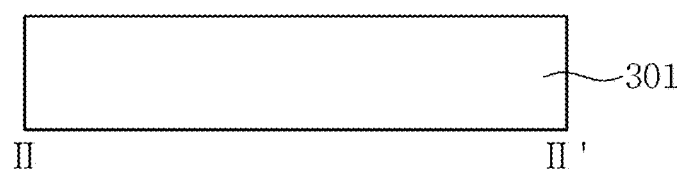
Figure 15B:
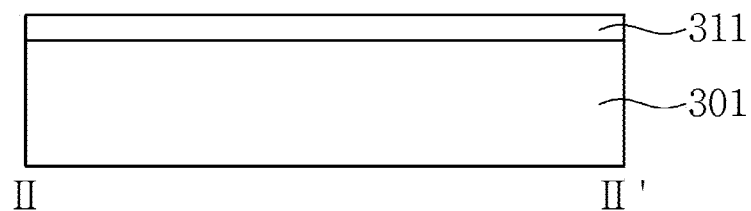

Subsequently, the first conductive layer is patterned through a photolithography process and an etching process such that a gate line GL and a storage electrode 326 are formed on the first substrate 301 as illustrated in FIGS. 14A and 15A. The first conductive layer may be removed by the wet-etching method described above.

Figure 14B:
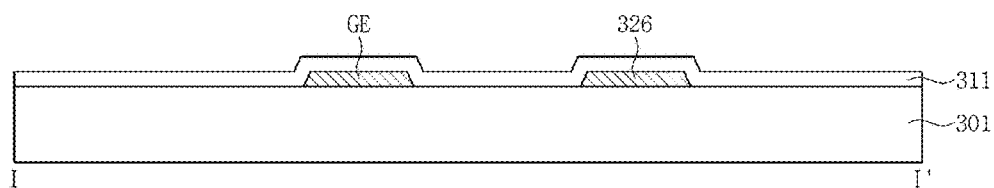

Next, as illustrated in FIGS. 14B and 14B, a gate insulating layer 311 is deposited over substantially the entire surface of the first substrate 301 including the gate line GL and the storage electrode 326. The gate insulating layer 311 may be deposited by a chemical vapor deposition (CVD) method. The gate insulating layer 311 may include a material included in the aforementioned gate insulating layer 311.

Subsequently, although not illustrated, a semiconductor material is deposited over substantially the entire surface of the first substrate 301 including the gate insulating layer 311. The semiconductor material may be deposited via a chemical vapor deposition (CVD) method. The semiconductor material may be indium gallium zinc oxide (IGZO) or amorphous indium gallium zinc oxide (a-IGZO).

Figure 14C:
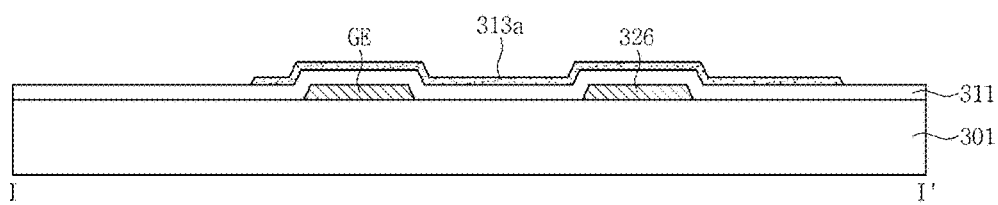
Figure 15C:
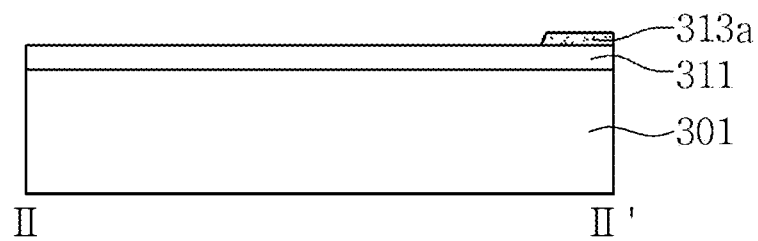

Next, the semiconductor material is patterned through a photolithography process and an etching process such that a semiconductor pattern 313a is formed, as illustrated in FIGS. 14C and 15C. The semiconductor pattern 313a is disposed on the gate insulating layer 311 to overlap the gate electrode GE. The semiconductor material may be removed by a dry-etching method as described above.

Subsequently, although not illustrated, a second conductive layer is deposited over substantially the entire surface of the first substrate 301, including the semiconductor pattern 313a. The second conductive layer may include a same material as that included in the aforementioned data line DL.

Figure 14D:
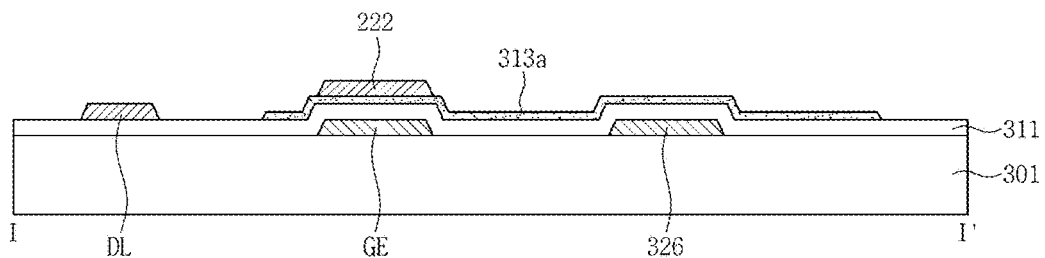
Figure 15D:
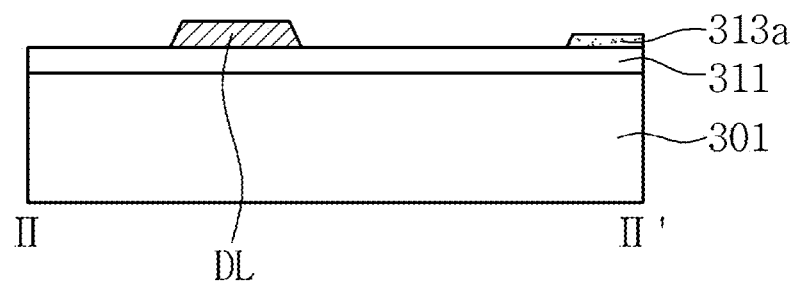

The second conductive layer is then patterned through a photolithography process and an etching process such that a data line DL and a masking pattern 222 are formed on the gate insulating layer 311 and the semiconductor pattern 313a respectively, as illustrated in FIGS. 14D and 15D. The second conductive layer may be removed by a wet-etching method as described above.

Figure 14E:
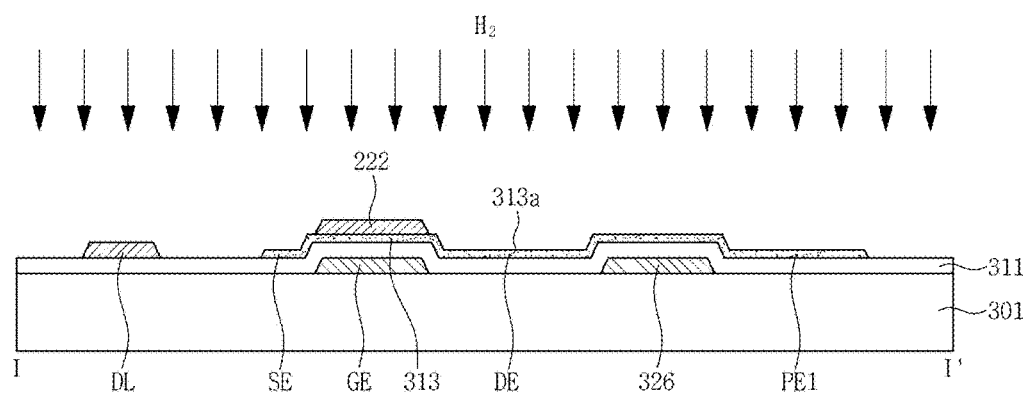
Figure 15E:
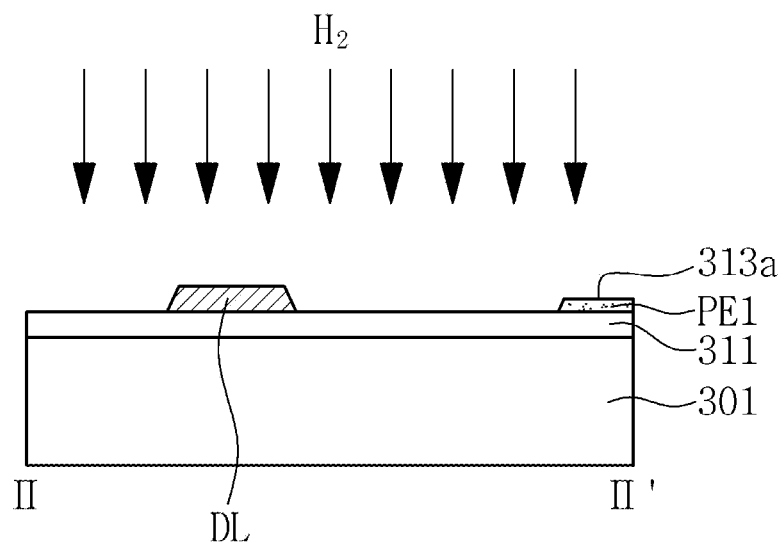

Subsequently, as illustrated in FIGS. 14E and 15E, in the state that the masking pattern 222 is used as a mask, impurities (or impurity ions) are injected (or doped) into the semiconductor pattern 313a. The impurities may be injected to the semiconductor pattern 313a through a plasma scheme. The impurities may use hydrogen ($H_2$). In such an exemplary embodiment, the impurities may be injected into the semiconductor pattern 313a in a selective manner (or partially) due to the masking pattern 222.

Through the impurity injection process, a source electrode SE, a semiconductor layer 313, a drain electrode DE, and a first pixel electrode PE1 are formed. That is, a portion of the semiconductor pattern 313a that overlaps the masking pattern 222 and is not injected with impurities functions as the semiconductor layer 313, and another portion of the semiconductor pattern 313a injected with impurities is metalized to function as the source electrode SE, the drain electrode DE, and the first pixel electrode PE1.

Figure 14F:
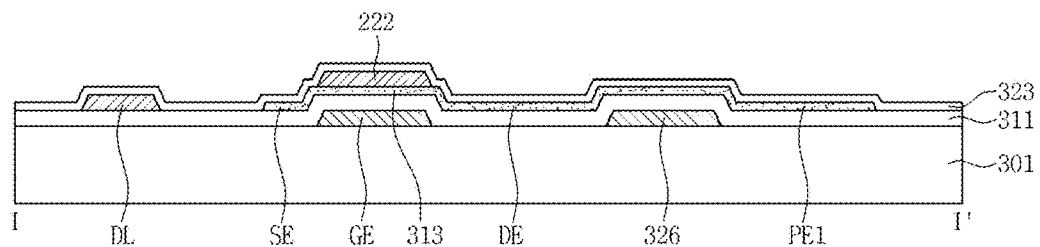
Figure 15F:
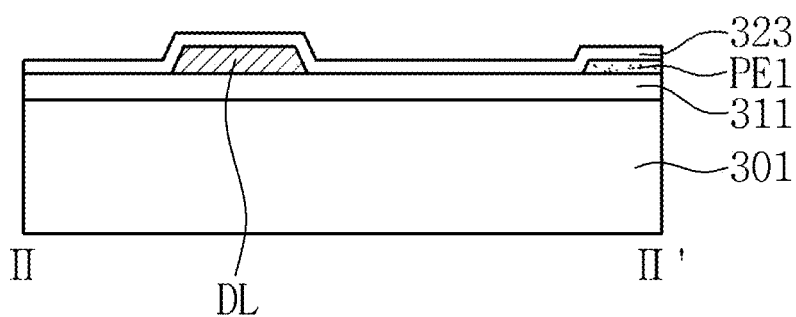
Figure 15G:
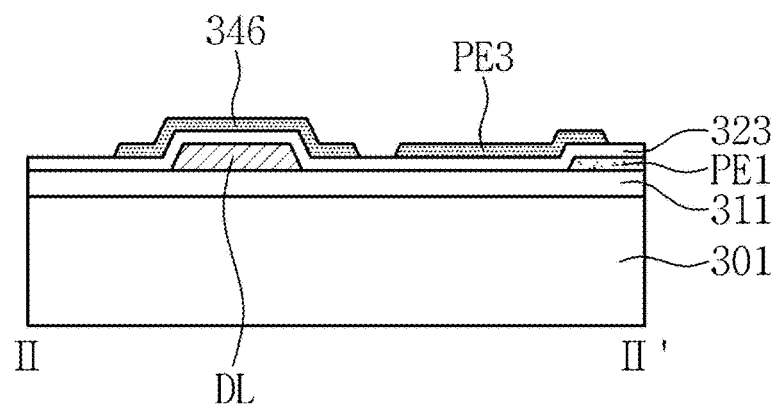

Subsequently, as illustrated in FIGS. 14F and 15F, a passivation layer 323 is deposited over substantially the entire surface of the first substrate 301 including the data line DL, the masking pattern 222, the source electrode SE, the drain electrode DE, and the first pixel electrode PE1. The passivation layer 323 may include a material included in the aforementioned passivation layer 323.

Figure 14G:
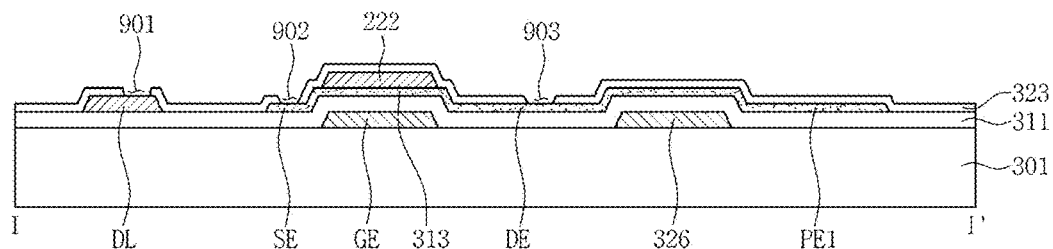

Subsequently, the passivation layer 323 is removed in a selective manner through a photolithography process and an etching process, such that a data contact hole 901, a source contact hole 902, and a drain contact hole 903 are defined as illustrated in FIG. 14G. The data line DL is exposed through the data contact hole 901, the source electrode SE is exposed through the source contact hole 902, and the drain electrode DE is exposed through the drain contact hole 903.

Next, although not illustrated, a transparent metal layer is deposited over substantially the entire surface of the first substrate 301 including the data contact hole 901, the source contact hole 902, the drain contact hole 903, and the passivation layer 323. The transparent metal layer may include a material included in the second pixel electrode PE2.

Figure 14H:
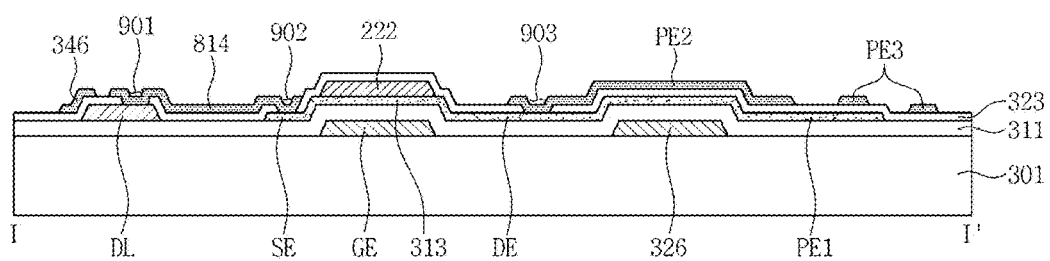

Then, the transparent metal layer is patterned through a photolithography process and an etching process such that a light blocking electrode 346, a second pixel electrode PE2, a third pixel electrode PE3, and a connecting electrode 814 are formed on the passivation layer 323 as illustrated in FIGS. 14H and 15H. The connecting electrode 814 electrically connects the data line DL and the source electrode SE through the data contact hole 901 and the source contact hole 902. The second pixel electrode PE2 is electrically connected to the drain electrode DE through the drain contact hole 903.

In an exemplary embodiment, the data line DL of FIG. 12 may directly contact the source electrode SE without the connecting electrode 814. In such an exemplary embodiment, the data line DL is disposed on the source electrode SE. For example, the data line DL is formed subsequent to the process of manufacturing the masking pattern 222 and the impurity injection process, and in such an exemplary embodiment, the data line DL directly contacts the source electrode SE. To this end, for example, the source electrode SE of FIG. 12 further extends from the data line DL to contact the data line DL directly.

In an exemplary embodiment, the display device illustrated in FIG. 1 may further include the storage electrode 326 illustrated in FIG. 11. In such an exemplary embodiment, the storage electrode 326 may include a same material as that included in the data line DL of FIG. 1. That is, in the case that the display device of FIG. 1 further includes the storage electrode 326, the storage electrode 326 is disposed on a same layer as the data line DL of FIG. 1. In such an exemplary embodiment, the storage electrodes 326 with the data line DL therebetween are connected to one another by a separate connecting electrode. The connecting electrode may include a same material as that included in the second pixel electrode PE2.

Figure 16:
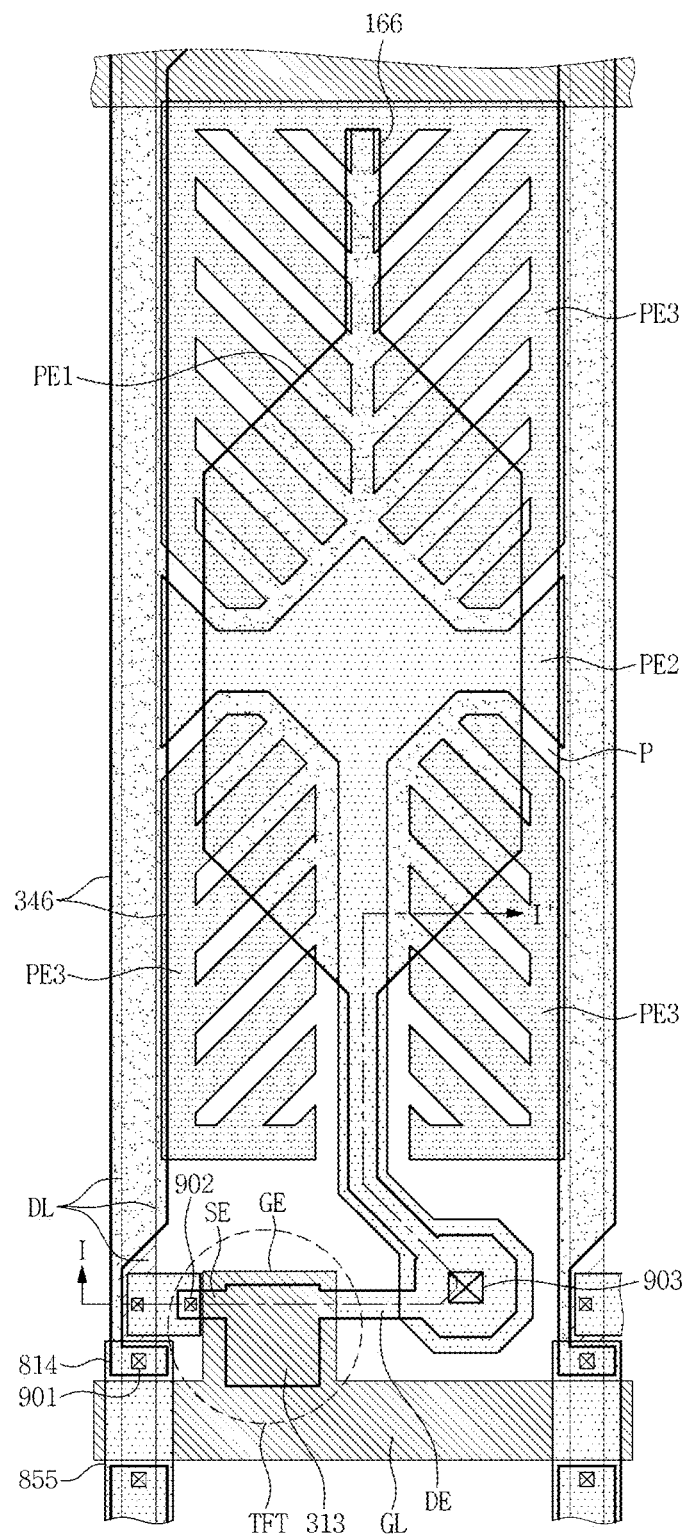
FIG. 16 is a plan view illustrating still another exemplary embodiment of the display device.

FIG. 16 is a plan view illustrating still another exemplary embodiment of the display device.

As illustrated in FIG. 16, the display device may further include an extension electrode 166. The extension electrode 166 extends from a first pixel electrode PE1. The extension electrode 166 and the first pixel electrode PE1 are unitary. In particular, the extension electrode 166 extends from the first pixel electrode PE1 and may be considered an extension thereof. The extension electrode 166 overlaps a central portion of a first floating electrode 701.

A transmittance of the central portion of the first floating electrode 701 may increase by virtue of the extension electrode 166.

Herein, certain configurations included in the display device illustrated in FIG. 16 are the same as the corresponding configurations included in the display device illustrated in FIG. 1, and thus descriptions pertaining thereto will make reference to FIG. 1 and the related descriptions.

In an exemplary embodiment, although not illustrated, the display device illustrated in FIG. 11 may further include the aforementioned extension electrode 166.

Figure 17:
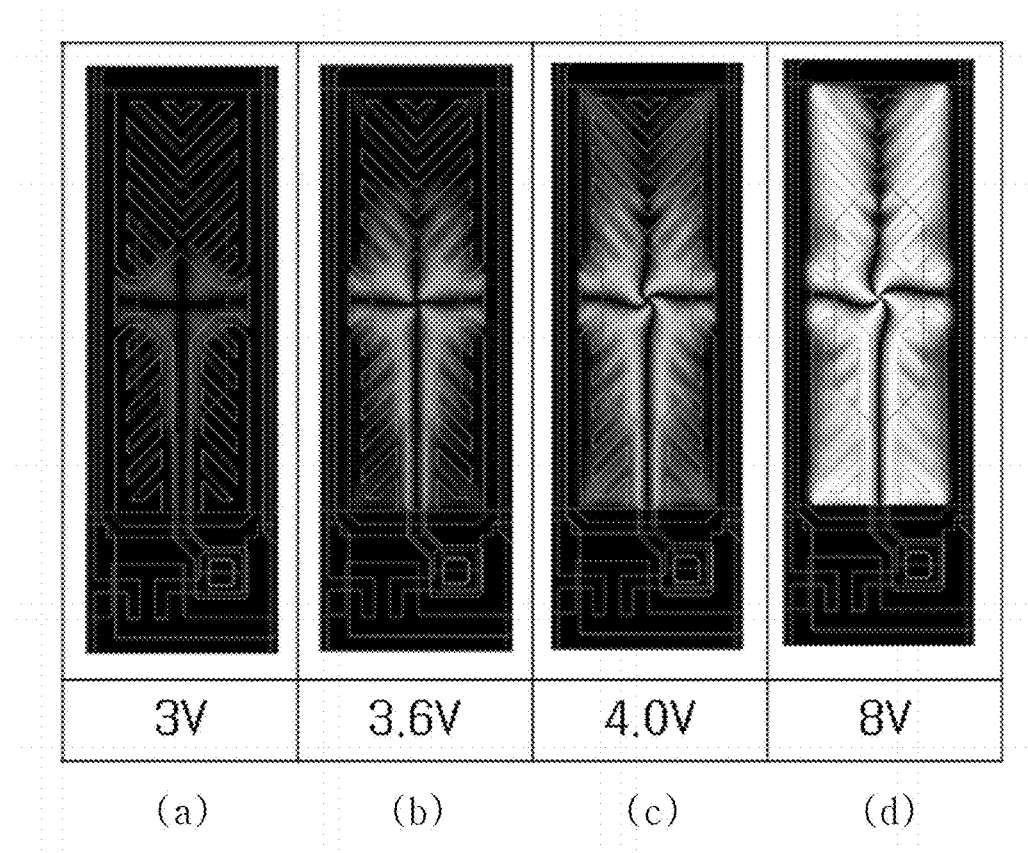
FIG. 17 is a view illustrating a transmittance of a pixel based on a data voltage applied to an exemplary embodiment of the display device.

FIG. 17 is a view illustrating a transmittance of a pixel based on a data voltage applied to an exemplary embodiment of the display device. In FIG. 17, a relatively bright portion corresponds to a portion from which light is generated.

As illustrated in FIG. 17(A), in the case that a data voltage of about 3 [V] is applied to the first pixel electrode PE1 and the second pixel electrode PE2, light of a relatively low intensity is generated from a central portion of a pixel area. As the data voltage increases, the transmittance of the pixel increases. For example, as illustrated in FIG. 17(D), in the case that a data voltage of about 8 [V] is applied, light of a relatively high intensity is generated from a relatively larger portion of the pixel area. As such, as the data voltage increases, the transmittance of the pixel area increases.

Figure 18:
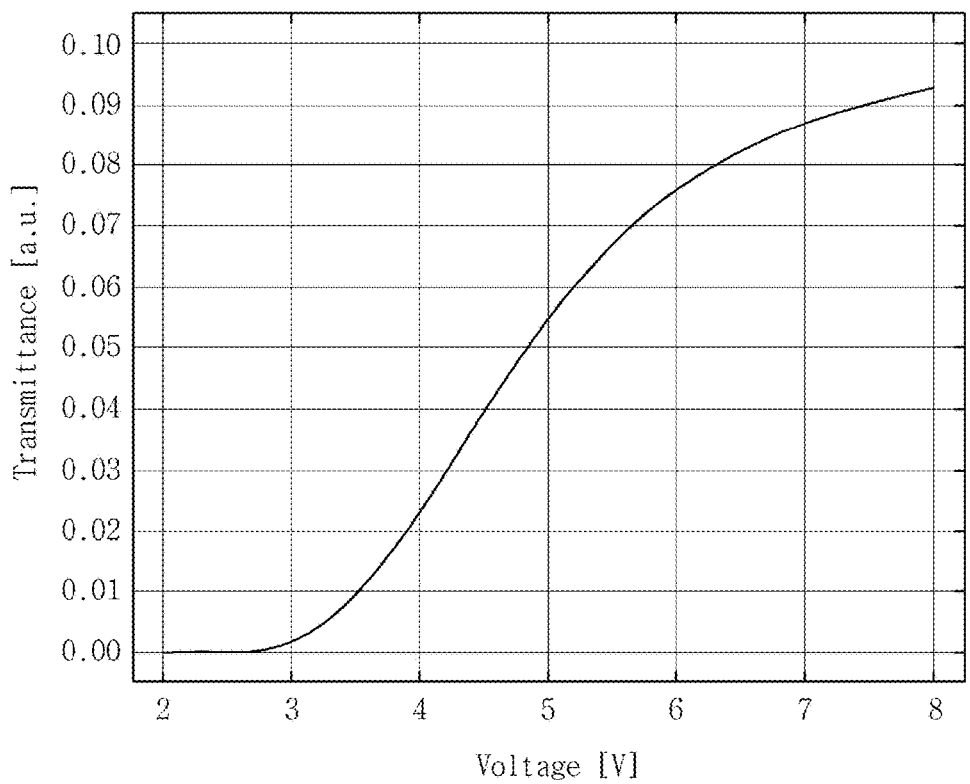
FIG. 18 is a graph illustrating a front transmittance of an exemplary embodiment of the display device.
Figure 19:
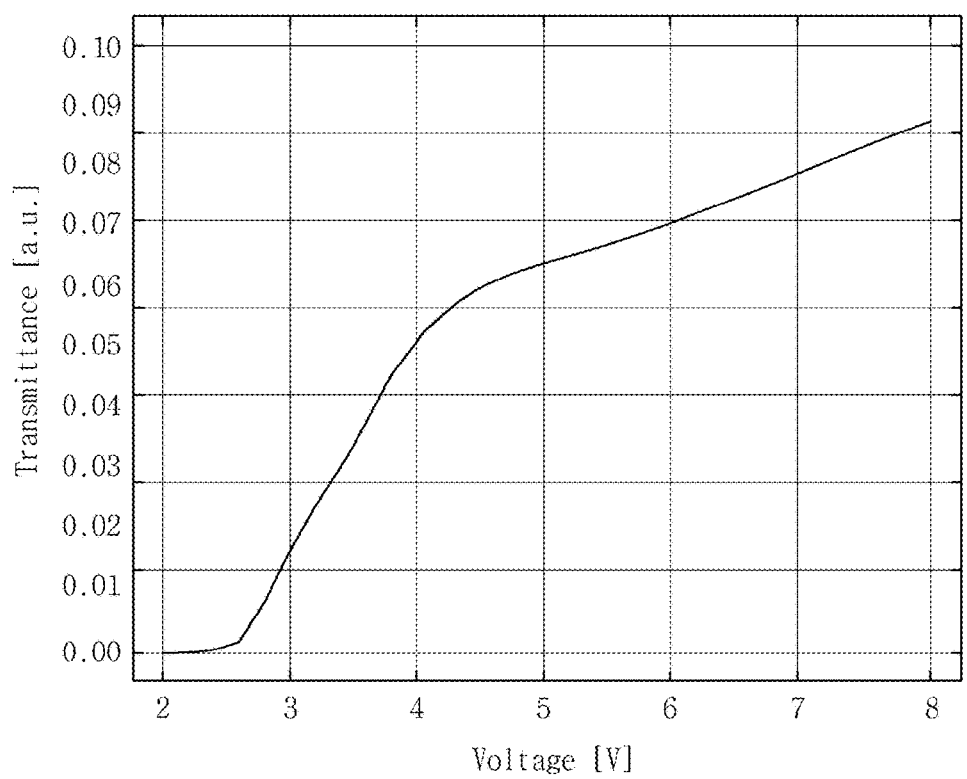
FIG. 19 is a graph illustrating a side transmittance of an exemplary embodiment of the display device.

FIG. 18 is a graph illustrating a front transmittance of an exemplary embodiment of the display device, and FIG. 19 is a graph illustrating a side transmittance of an exemplary embodiment of the display device.

In the graphs of FIGS. 18 and 19, the x-axis denotes a data voltage, and the y-axis denotes a transmittance. The front transmittance refers to a transmittance of light generated perpendicular to a display surface of the display device, and the side transmittance refers to a transmittance of light generated at an angle of about sixty degrees to the left side (or to the right side) with respect to a normal line of the display surface.

Figure 20:
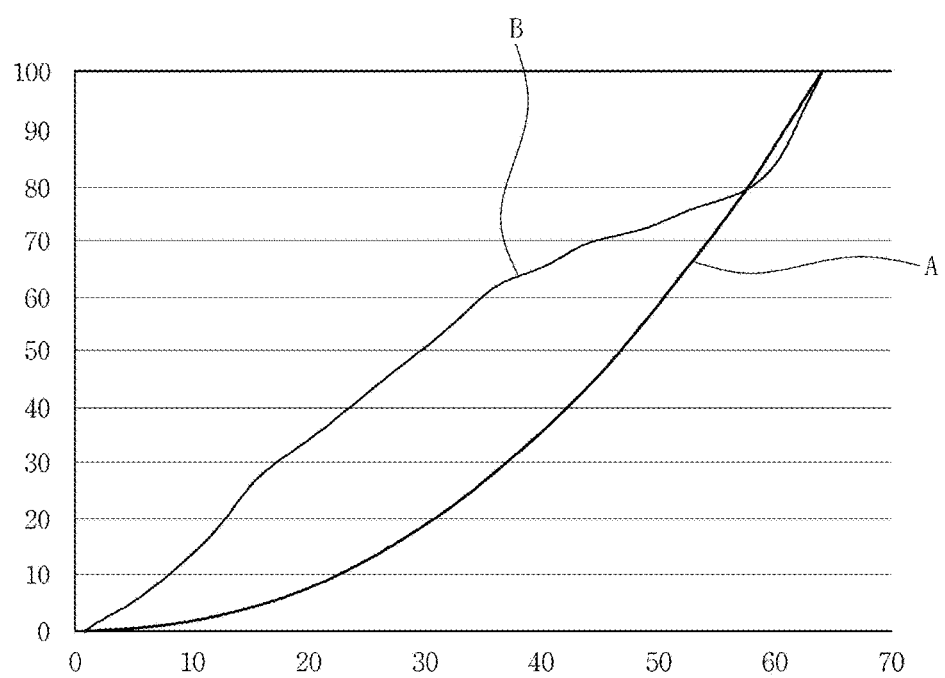
FIG. 20 is a gamma curve of an exemplary embodiment of the display device.

FIG. 20 is a gamma curve of an exemplary embodiment of the display device. In FIG. 20, curve A represents a standard or conventional gamma curve (or a master gamma curve) having a gamma of 2.2, and curve B represents a gamma curve for exemplary embodiments. In FIG. 20, the x-axis denotes a gray level, and the y-axis denotes a normalized transmittance.

As illustrated in FIG. 20, the gamma curve of the exemplary embodiments exhibits more segmented transmittance in a middle gray level as compared to that of the standard gamma curve.

As set forth above, according to one or more exemplary embodiments, the source electrode, the semiconductor layer, the drain electrode, and the pixel electrode may be manufactured using a single mask. Accordingly, a process of fabricating the display device may be simplified and a fabricating cost thereof may be reduced.

Further, according to one or more exemplary embodiments, the light blocking electrode and the second and third pixel electrodes are disposed on different layers, such that plan-view areas of the second and third pixel electrodes may increase. Accordingly, an aperture ratio of the pixel may increase.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the invention.

What is claimed is:

1. A display device comprising:
   a substrate;
   a gate line and a data line on the substrate;
   a switching element electrically connected to the gate line and the data line, the switching element including a source electrode and a drain electrode;
   a common electrode overlapping the data line;
   a light blocking electrode overlapping the data line, electrically isolated from the data line, and positioned between the data line and the common electrode;
   a first pixel electrode electrically connected to the switching element;
   an insulating interlayer on a semiconductor layer of the switching element; and
   a gate electrode disposed on the insulating interlayer and connected to the gate line;
   wherein at least one of the source electrode and the drain electrode of the switching element comprises a same material as a material included in the first pixel electrode,
   wherein the insulating interlayer has substantially a same shape as a shape of the gate line and the gate electrode.

2. The display device as claimed in claim 1, wherein a semiconductor layer of the switching element, the source electrode, the drain electrode, and the first pixel electrode each comprise substantially a same semiconductor material.

3. The display device as claimed in claim 2, wherein each of the source electrode, the drain electrode, and the first pixel electrode comprises a greater amount of impurities than an amount of impurities included in the semiconductor layer.

4. The display device as claimed in claim 2, wherein the semiconductor material comprises one of indium gallium zinc oxide (IGZO) and amorphous indium gallium zinc oxide (a-IGZO).

5. The display device as claimed in claim 1, wherein at least one of the source electrode and the drain electrode is unitary with the first pixel electrode.

6. The display device as claimed in claim 5, wherein a semiconductor layer of the switching element is unitary with at least one of the source electrode and the drain electrode.

7. The display device as claimed in claim 1, wherein at least one of the source electrode and the drain electrode has substantially a same thickness as a thickness of the first pixel electrode.

8. The display device as claimed in claim 7, wherein a semiconductor layer of the switching element has substantially a same thickness as the thickness of the first pixel electrode.

9. The display device as claimed in claim 1, wherein the light blocking electrode comprises a same material as a material included in the first pixel electrode.

10. The display device as claimed in claim 1, further comprising:
   a passivation layer on the gate electrode, the gate line, and the first pixel electrode;
   a second pixel electrode disposed on the passivation layer and connected to the drain electrode through a drain contact hole in the passivation layer; and
   a third pixel electrode disposed on the passivation layer and not physically contacting another conductor;
   a data insulating layer between the data line and the passivation layer; and
   a connecting electrode connecting the source electrode and the data line through a source contact hole in the passivation layer and a data contact hole in the passivation layer and the data insulating layer.

11. The display device as claimed in claim 1, further comprising:
   a gate electrode disposed between the substrate and a semiconductor layer of the switching element, the gate electrode connected to the gate line;
   a gate insulating layer between the gate electrode and the semiconductor layer, between the substrate and the source electrode, between the substrate and the drain electrode, between the substrate and the first pixel electrode, and between the substrate and the data line; and
   a masking pattern on the semiconductor layer.

12. The display device as claimed in claim 11, further comprising:
   a passivation layer on the source electrode, the drain electrode, the semiconductor layer, the first pixel electrode, the data line, and the masking pattern;
   a second pixel electrode disposed on the passivation layer and connected to the drain electrode through a drain contact hole in the passivation layer;
   a third pixel electrode disposed on the passivation layer and not physically connecting another conductor; and
   a connecting electrode connecting the source electrode and the data line through a source contact hole in the passivation layer and a data contact hole in the passivation layer.

13. A display device comprising:
   a substrate;
   a gate line and a data line on the substrate;
   a switching element electrically connected to the gate line and the data line, the switching element including a source electrode and a drain electrode;
   a first pixel electrode electrically connected to the switching element;
   a light blocking electrode on the data line;
   a second pixel electrode on the first pixel electrode, the second pixel electrode electrically connected with the drain electrode;
   an insulating interlayer on a semiconductor layer of the switching element; and
   a gate electrode disposed on the insulating interlayer and connected to the gate line;
   wherein at least one of the source electrode and the drain electrode of the switching element comprises a same material as a material included in the first pixel electrode,
   wherein the second pixel electrode is disposed on a different layer from a layer on which the overlapping electrode is disposed,
   the insulating interlayer has substantially a same shape as a shape of the gate line and the gate electrode.

* * * * *